(12) United States Patent
Gillingham

(10) Patent No.: US 8,063,658 B2
(45) Date of Patent: Nov. 22, 2011

(54) TERMINATION CIRCUIT FOR ON-DIE TERMINATION

(75) Inventor: Peter Gillingham, Kanata (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 0 days.

(21) Appl. No.: 12/685,365

(22) Filed: Jan. 11, 2010

(65) Prior Publication Data
US 2010/0201397 A1  Aug. 12, 2010

Related U.S. Application Data

(60) Provisional application No. 61/151,886, filed on Feb. 12, 2009.

(51) Int. Cl.
*H03K 17/16* (2006.01)
*H03K 19/003* (2006.01)

(52) U.S. Cl. ............. 326/30; 326/81; 326/87; 326/113; 327/109; 327/112

(58) Field of Classification Search .............. 326/30, 326/80–83, 86–87, 112–113; 327/108–109, 327/112
See application file for complete search history.

(56) References Cited

U.S. PATENT DOCUMENTS

| | | | | |
|---|---|---|---|---|
| 6,021,071 A * | 2/2000 | Otsuka | ...... | 365/189.05 |
| 6,037,798 A * | 3/2000 | Hedberg | ...... | 326/30 |
| 6,433,619 B2 | 8/2002 | Akita et al. | | |
| 6,605,958 B2 * | 8/2003 | Bergman et al. | ...... | 326/30 |
| 6,642,740 B2 * | 11/2003 | Kim et al. | ...... | 326/30 |
| 6,670,828 B2 * | 12/2003 | Ramaswamy | ...... | 326/83 |
| 6,894,529 B1 * | 5/2005 | Chong et al. | ...... | 326/30 |
| 6,903,581 B2 | 6/2005 | Clark et al. | | |
| 7,034,567 B2 | 4/2006 | Jang | | |
| 7,064,576 B1 * | 6/2006 | Maangat | ...... | 326/30 |
| 7,078,943 B2 | 7/2006 | Ho et al. | | |
| 7,154,981 B2 | 12/2006 | Tokuhiro et al. | | |
| 7,161,865 B2 | 1/2007 | Fujisawa | | |

(Continued)

FOREIGN PATENT DOCUMENTS

WO   03/017112 A2   2/2003

(Continued)

OTHER PUBLICATIONS

Ho Young Song et al., "A 1.2Gb/s/pin Double Data Rate SDRAM with On-Die Termination", ISSCC 2003 / Session 17 / SRAM and DRAM / Paper 17.8, Feb. 12, 2003, © 2003 IEEE, 2003 IEEE International Solid-State Circuits Conference, 10 pages.

(Continued)

*Primary Examiner* — Jason M Crawford

(57) ABSTRACT

In a semiconductor device having a terminal connected to an internal portion, a termination circuit for providing on-die termination for the terminal of the device. The termination circuit comprises a plurality of transistors, including at least one NMOS transistor and at least one PMOS transistor, connected between the terminal and a power supply; and control circuitry for driving a gate of each of NMOS transistor with a corresponding NMOS gate voltage and for driving a gate of each PMOS transistor with a corresponding PMOS gate voltage, the control circuitry being configured to control the NMOS and PMOS gate voltages so as to place the transistors in an ohmic region of operation when on-die termination is enabled. The power supply supplies a voltage that is less than each said NMOS gate voltage and greater than each said PMOS gate voltage.

50 Claims, 11 Drawing Sheets

U.S. PATENT DOCUMENTS

| | | | |
|---|---|---|---|
| 7,282,791 | B2 | 10/2007 | Funaba et al. |
| 7,282,955 | B2 | 10/2007 | Kim |
| 7,318,183 | B2 | 1/2008 | Ito et al. |
| 7,368,937 | B2 | 5/2008 | Song |
| 7,372,294 | B2 | 5/2008 | Kim |
| 7,391,230 | B2 | 6/2008 | Kobayashi |
| 7,403,040 | B2 | 7/2008 | Park et al. |
| 7,429,881 | B2 * | 9/2008 | Deng et al. ............... 327/52 |
| 7,459,929 | B2 | 12/2008 | Chung |
| 7,495,468 | B2 | 2/2009 | You |
| 7,495,469 | B2 | 2/2009 | Park |
| 7,612,604 | B2 * | 11/2009 | Miyazaki et al. ............. 327/534 |
| 2002/0175700 | A1 | 11/2002 | Nagano et al. |
| 2003/0042573 | A1 | 3/2003 | Fan et al. |
| 2003/0189441 | A1 | 10/2003 | Nguyen et al. |
| 2004/0004494 | A1 | 1/2004 | Song |
| 2004/0141391 | A1 | 7/2004 | Lee et al. |
| 2004/0227205 | A1 | 11/2004 | Walmsley |
| 2005/0099834 | A1 | 5/2005 | Funaba et al. |
| 2005/0225353 | A1 * | 10/2005 | Kwon ............... 326/30 |
| 2005/0226080 | A1 | 10/2005 | Lee |
| 2005/0248362 | A1 | 11/2005 | Choe |
| 2006/0053243 | A1 | 3/2006 | David et al. |
| 2006/0091900 | A1 | 5/2006 | Kang et al. |
| 2006/0132171 | A1 | 6/2006 | Nguyen |
| 2006/0232294 | A1 | 10/2006 | Song |
| 2007/0164844 | A1 * | 7/2007 | Lin et al. ............... 338/13 |
| 2007/0205848 | A1 | 9/2007 | Park et al. |
| 2008/0211535 | A1 | 9/2008 | King |
| 2008/0258756 | A1 | 10/2008 | Kobayashi |
| 2008/0278193 | A1 | 11/2008 | Park et al. |
| 2008/0284465 | A1 | 11/2008 | Kao |
| 2008/0290894 | A1 | 11/2008 | Sohn |
| 2008/0303546 | A1 | 12/2008 | Millar |
| 2008/0315978 | A1 | 12/2008 | Knight et al. |
| 2009/0009212 | A1 | 1/2009 | Brox |
| 2009/0015290 | A1 | 1/2009 | Park |
| 2010/0066404 | A1 * | 3/2010 | Zhang et al. ............... 326/30 |

FOREIGN PATENT DOCUMENTS

WO PCT/CA2010/000027    3/2010

OTHER PUBLICATIONS

Yen-Sung Michael Lee, "Application of Active Inductors in High-Speed I/O Circuits", Thesis submitted in partial fulfillment of the requirements for the degree of Master of Applied Science in the Faculty of Graduate Studies (Electrical and Computer Engineering), The University of British Columbia (Vancouver), Oct. 2008, © Yen-Sung Michael Lee, 2008, 77 pages.

Ambrish Kant Varma, "Improved Behavioral Modeling Based on the Input Output Buffer Information Specification", A dissertation submitted to the Graduate Faculty of North Carolina State University in partial fulfillment of the requirements for the Degree of Doctor of Philosophy, Computer Engineering, Raleigh, NC, 2007, 191 pages.

"OP-Amp Output Limitations", (Section 7.11 in text), http://www.optics.arizona.edu/opti360/Week%209.pdf, The University of Arizona, College of Optical Sciences, OPTI 360 Electronics for Optical Engineers and Scientists, Fall 2008, 19 pages.

Samsung Electronics, "DDR2 Application Note ODT (On Die Termination) Control", Mar. 2006, Product Planning & Application Engineering Team, Memory Division, Samsung Electronics Co., Ltd., 12 pages.

Wikipedia, "On-die termination", http://en.wikipedia.org/wiki/On-die_termination, downloaded on Mar. 9, 2009, 2 pages.

National Instruments, "Proper Termination for High-Speed Digital I/O Applications", Sep. 6, 2006, http://zone.ni.com/devzone/cda/tut/p/id/3854, downloaded on Mar. 9, 2009, 4 pages.

Elpida, "New Function of DDR2 SDRAM On Die Termination (ODT)", Document No. E0593E10 (Ver. 1.0), Jan. 2005, Japan, http://www.elpida.com, © Elpida Memory, Inc. 2005, 12 pages.

Rambus, "On Die Termination (ODT) Calibration", http://www.rambus.com/kr/patents/innovations/detail/odt_calib.html, downloaded on Mar. 9, 2009, Copyright 2009 Rambus Inc., 3 pages.

JEDEC, "DDR2 SDRAM Specification", JESD79-2B (Revision of JESD79-2A), Jan. 2005, © JEDEC Solid State Technology Association 2005, 113 pages.

JEDEC, "DDR3 SDRAM Specification", JESD79-3B (Revision of JESD79-3A, Sep. 2007), Apr. 2008, © JEDEC Solid State Technology Association 2007, 200 pages.

\* cited by examiner

TERMINATION CIRCUIT FOR ON-DIE TERMINATION

CROSS-REFERENCE TO RELATED APPLICATION

The present application claims the benefit under 35 USC §119(e) of U.S. Provisional Patent Application Ser. No. 61/151,886 to Peter B. Gillingham, filed Feb. 12, 2009, hereby incorporated by reference herein.

BACKGROUND

When a signal travels along a path that has an impedance discontinuity (or "mismatch"), the signal is partly reflected. The reflected signal interferes with the original signal and this can result in a loss of signal integrity and an incorrect signal level being detected by a receiver. To mitigate the onset of signal reflection, it is beneficial to place circuitry with the equivalent amount of impedance at the point of discontinuity. This is referred to as "termination". For example, resistors can be placed on computer motherboards to terminate high speed buses.

Although termination resistors reduce reflections at an extremity of the signal path, they are unable to prevent reflections resulting from stub lines that connect to other semiconductor chips at various points along the path. This situation can arise, for example, when multiple memory modules are connected along a memory bus. A signal propagating from a memory controller along the memory bus encounters an impedance discontinuity at each stub line leading to a particular memory module. The signal that propagates along the stub line leading to the particular memory module will be reflected back onto the memory bus, thereby introducing unwanted noise into the signal.

Accordingly, it is useful to provide each semiconductor chip with its own termination circuitry. Providing this termination circuitry on the same semiconductor chip that includes a bus transmitter an/or receiver is known as on-die termination (ODT). On-die termination can reduce the number of resistor elements and complex wirings on the motherboard. Thus, in addition to improved signal integrity, which allows components to be operated at higher frequencies, on-die termination enables a simpler and more cost effective system design.

However, conventional on-die termination techniques have tended to be power hungry and/or inflexible.

SUMMARY

According to a first broad aspect, the present invention seeks to provide, in a semiconductor device having a terminal connected to an internal portion, a termination circuit for providing on-die termination for a terminal of the semiconductor device. The termination circuit comprises a plurality of transistors connected between the terminal and a power supply, the plurality of transistors including at least one NMOS transistor and at least one PMOS transistor; and control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled. The power supply supplies a voltage that is less than each said NMOS gate voltage and greater than each said PMOS gate voltage.

According to a second broad aspect, the present invention seeks to provide a semiconductor device with on-die termination, which comprises an internal portion; a power supply; a terminal connected to the internal portion; a plurality of transistors connected between the terminal and the power supply, the plurality of transistors including at least one NMOS transistor and at least one PMOS transistor; and control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled. The power supply supplies a voltage that is less than each said NMOS gate voltage and greater than each said PMOS gate voltage.

According to a third broad aspect, the present invention seeks to provide a semiconductor device with on-die termination, which comprises an internal portion; a power terminal for connection to an off-chip power supply; a data terminal connected to the internal portion; a plurality of transistors connected between the data terminal and the power terminal, the plurality of transistors including at least one NMOS transistor and at least one PMOS transistor; and control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled. The power terminal supplies a voltage that is less than each said NMOS gate voltage and greater than each said PMOS gate voltage.

According to a fourth broad aspect, the present invention seeks to provide, in a semiconductor device, a termination circuit for providing on-die termination for a terminal of the semiconductor device that is connected to an internal portion of the semiconductor device, wherein the termination circuit comprises a MOS transistor connected between the terminal and a power supply; and control circuitry for driving a gate of the MOS transistor with a gate voltage, the control circuitry being configured to control the gate voltage so as to place the MOS transistor in an ohmic region of operation when on-die termination is enabled, the gate voltage being controllable within a range of voltages so as to cause the MOS transistor when in the ohmic region of operation to impart a desired resistance within a range of resistances corresponding to the range of voltages.

In an embodiment, the MOS transistor is an NMOS transistor and the power supply supplies a voltage that is less than lowest voltage within said range of voltages.

In an embodiment, the MOS transistor is a PMOS transistor and the power supply supplies a voltage that is greater than the greatest voltage within said range of voltages.

In an embodiment, the power supply supplies a first voltage, the termination circuit further comprises at least one circuit element between the terminal and a second power supply that supplies a second voltage different from the first voltage. Also, in an embodiment, the at least one circuit element comprises a resistive device, the MOS transistor is a first MOS transistor, and the at least one circuit element comprises a second MOS transistor complementary to the first MOS transistor.

In an embodiment, the MOS transistor is a first MOS transistor, the termination circuit further comprises a plurality of MOS transistors connected between the terminal and the power supply, and the plurality of MOS transistors includes the first MOS transistor.

In an embodiment, the termination circuit is implemented on a first semiconductor chip, and the power supply is implemented on a second semiconductor chip different from the first semiconductor chip.

In an embodiment, the termination circuit and the power supply are implemented on the same semiconductor chip.

In an embodiment, the termination circuit further comprises the power supply, the power supply comprises a bias stage, an output stage and a capacitor, the output stage including a complementary pair of MOS transistors, the voltage supplied by the power supply is taken from a junction between the complementary pair of MOS transistors, and the capacitor is electrically connected between the junction and a reference potential.

In an embodiment, the termination circuit further comprises the power supply, the power supply comprises (i) a bias chain; (ii) an operational amplifier in a unity-gain configuration having an input connected to the bias chain and an output; and (iii) a capacitor connected between the output of the operational amplifier and a reference potential, and the voltage supplied by the power supply is taken from a junction between the output of the operational amplifier and the capacitor.

In an embodiment, the MOS transistor comprises a gate and a pair of current carrying electrodes, one of the current carrying electrodes is connected to the terminal, and the other of the current carrying electrodes is connected to the power supply and the gate is driven by the gate voltage from the control circuitry.

In an embodiment, the MOS transistor further comprises a substrate electrode connected to a power supply that supplies a substrate voltage.

In an embodiment, to place the MOS transistor in an ohmic region of operation, the gate voltage is set to a first voltage, and the substrate voltage is different from the first voltage.

In an embodiment, the MOS transistor is an NMOS transistor, the first voltage is approximately 1.8 V, and the substrate voltage is at approximately 0 V.

In an embodiment, the MOS transistor is a PMOS transistor, the first voltage is approximately 0 V, and the substrate voltage is at approximately 1.8 V.

In an embodiment, the first voltage is taken from a cell substrate back-bias power supply.

In an embodiment, the first voltage is taken from a wordline power supply.

In an embodiment, the control circuitry is further configured to place the plurality of transistors in an off state when on-die termination is disabled. In an embodiment, the control circuitry comprises an input for receiving an enable signal indicative of whether on-die termination is enabled or disabled.

In an embodiment, the control circuitry comprises calibrator circuitry configured to carry out a calibration process for identifying an analog calibration voltage that would cause the MOS transistor to impart the desired resistance if it were supplied to the MOS transistor as the gate voltage. In an embodiment, the calibration circuitry carries out the calibration process in response to detecting that a received calibration enable signal has been asserted.

In an embodiment, the control circuitry further comprises a multiplexer for causing the analog calibration voltage to be transferred to the gate voltage when on-die termination is enabled.

In an embodiment, the calibrator circuitry comprises an internal circuit element exhibiting a behaviour as a function of an applied voltage that corresponds to a behavior of the MOS transistor as a function of the gate voltage, and the calibration process comprises determining the analog calibration voltage as the level of the applied voltage that results in the internal circuit element exhibiting a resistance that substantially equals the desired resistance.

In an embodiment, the calibrator circuitry has access to a lookup table specifying a resistance behavior of the MOS transistor as a function of the gate voltage, and the calibration process comprises consulting the lookup table to determined the analog calibration voltage on a basis of the desired resistance.

In an embodiment, the electrical resistance between the power supply and the terminal is attributable in substantial part to the MOS transistor.

In an embodiment, the semiconductor device has a second terminal connected to the internal portion, the termination circuit further comprises a second MOS transistor connected between the second terminal and the power supply. In this embodiment, the control circuitry is further for driving a gate of the second MOS transistor with a second gate voltage, the control circuitry is further configured to control the second gate voltage so as to place the second MOS transistor in an ohmic region of operation when on-die termination is enabled, and the second gate voltage is controllable within a second range of voltages so as to cause the second MOS transistor when in the ohmic region of operation to impart a second desired resistance within a second range of resistances corresponding to the second range of voltages.

In an embodiment, the MOS transistor and the second MOS transistor are both NMOS transistors or are both PMOS transistors, and the range of voltages is the second range of voltages.

In an embodiment, the MOS transistor and the second MOS transistor are complementary MOS transistors, and the range of voltages is different from the second range of voltages.

According to a fifth broad aspect, the present invention seeks to provide a semiconductor device with on-die termination, which comprises an internal portion; a power supply; a terminal connected to the internal portion; a MOS transistor connected between the terminal and the power supply; control circuitry for driving a gate of the MOS transistor with a gate voltage, the control circuitry being configured to control the gate voltage so as to place the MOS transistor in an ohmic region of operation when on-die termination is enabled, the gate voltage being controllable within a range of voltages so as to cause the MOS transistor while in the ohmic region of operation to impart a desired resistance within a range of resistances corresponding to the range of voltages.

According to a sixth broad aspect, the present invention seeks to provide a semiconductor device with on-die termination, which comprises an internal portion; a power terminal for connection to an off-chip power supply; a data terminal connected to the internal portion; a MOS transistor connected between the data terminal and the power terminal; and control circuitry for driving a gate of the MOS transistor with a gate voltage, the control circuitry being configured to control the gate voltage so as to place the MOS transistor in an ohmic region of operation when on-die termination is enabled, the gate voltage being controllable within a range of voltages so as to cause the MOS transistor while in the ohmic region of operation to impart a desired resistance within a range of resistances corresponding to the range of voltages.

These and other aspects and features of the present invention will now become apparent to those of ordinary skill in the art upon review of the following description of specific embodiments of the invention in conjunction with the accompanying drawings.

It is to be expressly understood that the description and drawings are only for the purpose of illustration of certain embodiments of the invention and are an aid for understanding. They are not intended to be a definition of the limits of the invention.

DETAILED DESCRIPTION

Figure 1:
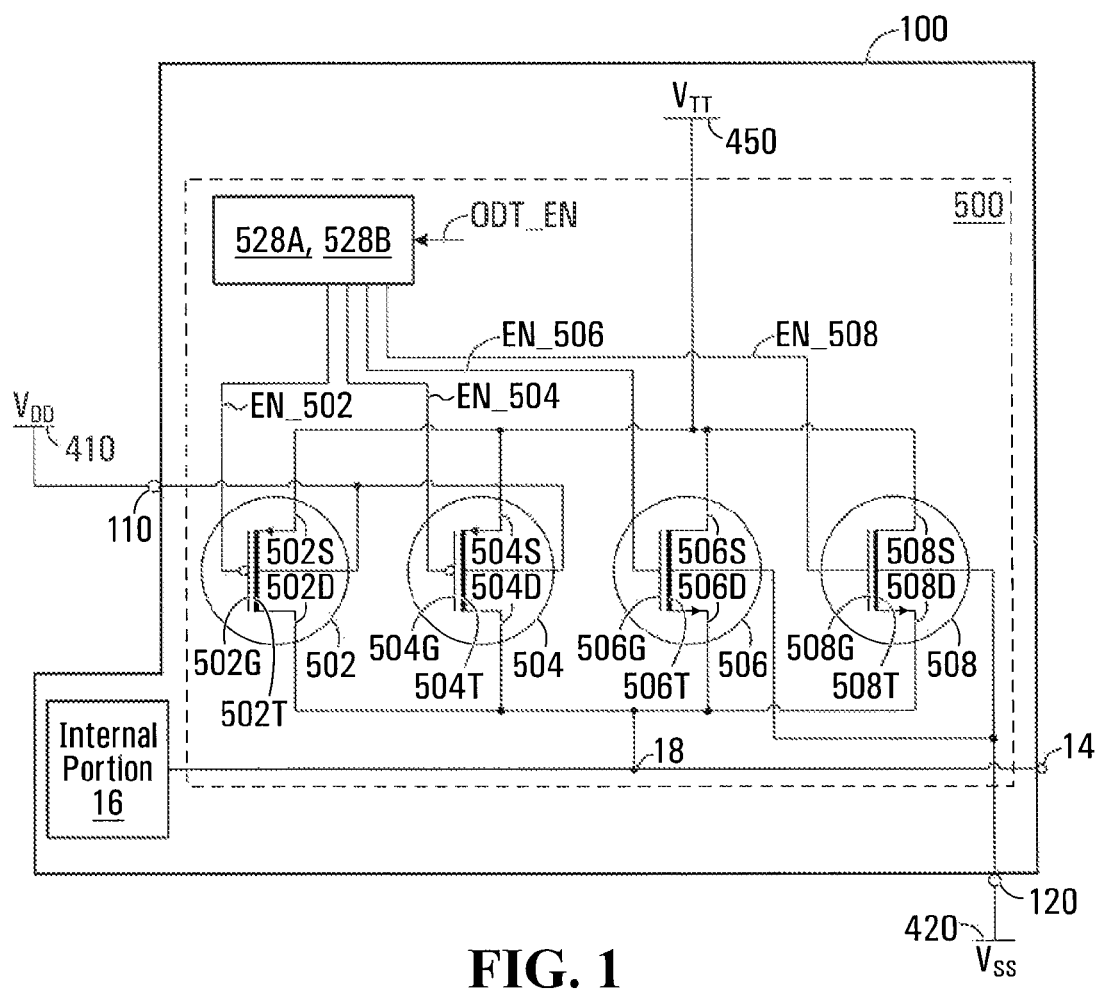
FIGS. 1 and 2 are circuit diagrams of a termination circuit for providing on-die termination for a terminal of a semiconductor device, in accordance with specific non-limiting embodiments of the present invention.
Figure 2:
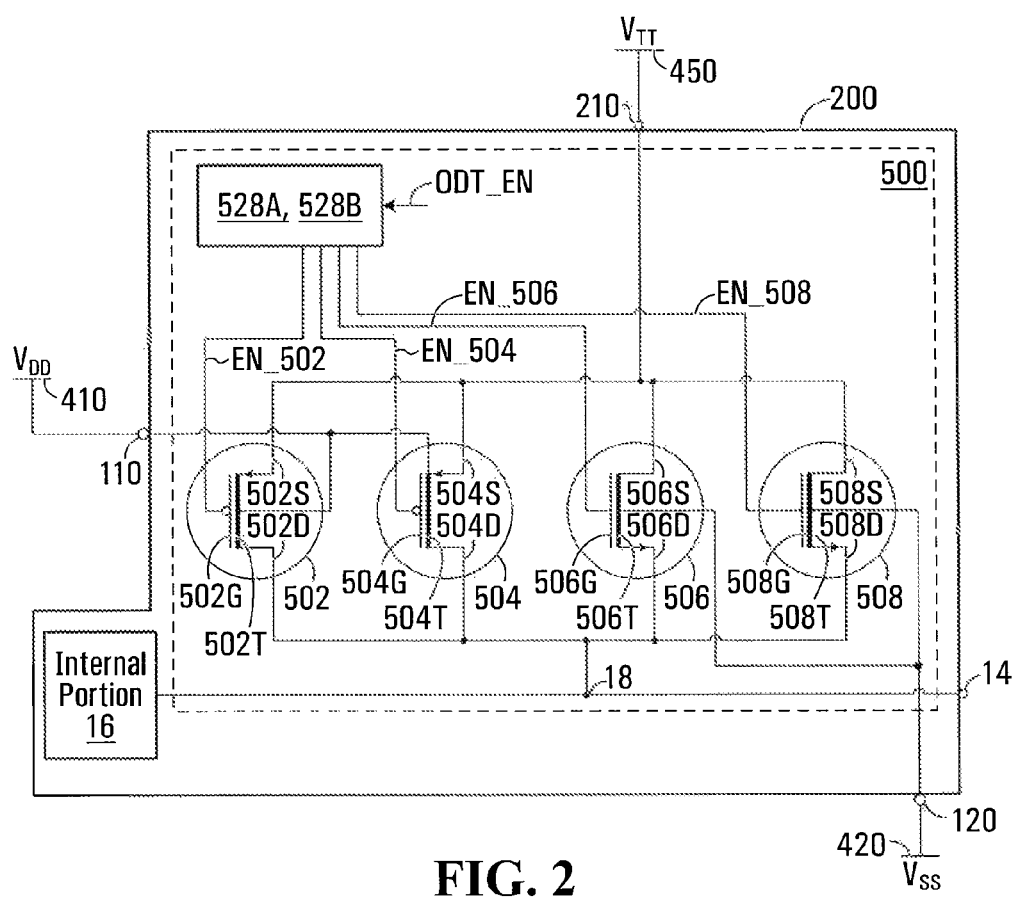

With reference to FIGS. 1 and 2, there is shown a termination circuit 500 for on-die termination of a terminal 14 connected to an internal portion 16 of a semiconductor device 100, 200. On-die termination can be used to preserve the integrity of a signal that is transmitted and/or received via the terminal 14. Accordingly, the terminal 14 can be an input terminal, an output terminal or a bidirectional input/output terminal. In certain non-limiting embodiments, the terminal 14 can be configured to transmit and/or receive data signals varying between two voltage levels representative of corresponding logic values. The semiconductor device 100, 200 that includes the internal portion 16 and the terminal 14 may be a memory chip (such as a dynamic random access memory (DRAM), synchronous DRAM (SDRAM), double data rate (DDR) SDRAM, etc.) or any other type of semiconductor device that can benefit from on-die termination.

Although the termination circuit 500 is shown as being connected within semiconductor device 100, 200 to a point (or node) 18 that is between the terminal 14 and the internal portion 16 of the semiconductor device 100, 200, it should be appreciated that it is within the scope of embodiments of the present invention for the termination circuit 500 to be connected directly to the terminal 14. Internal portion 16 may include input buffers, output buffers, combined input/output buffers, memory peripheral circuits, memory arrays (composed of DRAM, NAND Flash, NOR Flash, or other types of memory cells), to name a few non-limiting possibilities. The termination circuit 500 also includes a path between node 18 and a power supply 450, which is at a voltage $V_{TT}$.

As shown in FIG. 1, power supply 450 can be internal to the semiconductor device 100, in which case $V_{TT}$ can be said to be generated in an on-chip fashion. Alternatively, as shown in FIG. 2, power supply 450 can be external to the semiconductor device 200 and accessible via a terminal 210, for example. In this case, $V_{TT}$ can be said to be generated in an off-chip fashion. Power supply 450 can also be used for supplying the voltage $V_{TT}$ to other components of the semiconductor device 100, 200, such as those comprised in the internal portion 16. Alternatively, power supply 450 can be dedicated to the task of on-die termination.

The path between terminal 14 and power supply 450 (via point/node 18) includes a plurality of metal oxide semiconductor (MOS) transistors. At least one of the MOS transistors is a PMOS transistor and at least one of the MOS transistors is an NMOS transistor. In the illustrated embodiment, there are four (4) MOS transistors 502, 504, 506, 508, among which MOS transistors 502 and 504 are PMOS transistors and MOS transistors 506 and 508 are NMOS transistors. It should be appreciated, however, that there is no particular limitation on the number of MOS transistors in the path or on whether a particular MOS transistor in the path is a PMOS transistor or an NMOS transistor, except for the fact that there will be at least two MOS transistors including at least one PMOS transistor and at least one NMOS transistor. Also, the path between terminal 14 and power supply 450 (via point/node 18) can include MOS transistors placed in parallel, in series or a combination thereof.

Each of the MOS transistors 502, 504, 506, 508 includes a respective gate 502G, 504G, 506G, 508G, which those skilled in the art will understand to be a control electrode. The gate 502G, 504G, 506G, 508G of each of the MOS transistors 502, 504, 506, 508 is driven by a respective gate voltage EN_502, EN_504, EN_506, EN_508 supplied by termination control circuit 528A, 528B.

In addition, each of the MOS transistors 502, 504, 506, 508 includes a respective first current carrying electrode 502S, 504S, 506S, 508S and a respective second current carrying electrode 502D, 504D, 506D, 508D. One of the current carrying electrodes of each of the MOS transistors 502, 504, 506, 508 is connected to power supply 450, while the other of the current carrying electrodes of each of the MOS transistors 502, 504, 506, 508 is connected to terminal 14 (via point/node 18). Depending on which current carrying electrode is at a higher potential, either the first current carrying electrode will act as the "source" and the second current carrying electrode will act as the "drain", or vice versa.

Furthermore, each of the MOS transistors 502, 504, 506, 508 includes a respective substrate electrode 502T, 504T, 506T, 508T. The substrate electrode 502T, 504T of each of the PMOS transistors 502, 504 is connected to a power supply 410 via a pin 110, while the respective substrate electrode 506T, 508T of each of the NMOS transistors 506, 508 is connected to a power supply 420 via a pin 120. Power supply 410 can be maintained at a voltage $V_{DD}$, while power supply 420 can be kept at a voltage $V_{SS}$. The voltages $V_{DD}$ and $V_{SS}$ can be selected such that they provide sufficient voltage "headroom" to allow the components of the semiconductor device 100, 200 and, in particular, the termination circuit 500, to function properly within the expected voltage swing of the signals at the terminal 14. Thus, when the signals at the terminal 14 are expected to vary between, say, 0.45V and 1.35V, it is possible to set $V_{DD}$ to 1.8V and to set $V_{SS}$ to 0V. If terminal 14 is an output terminal, the voltages $V_{DD}$ and $V_{SS}$ may also be employed to power the output buffer. In DDR SDRAM these voltages are referred to as $V_{DDQ}$ and $V_{SSQ}$. Other possibilities are contemplated as being within the scope of certain embodiments of the present invention, e.g., $V_{DD}$ could be set to 1.5V.

The termination control circuit 528A, 528B receives an "ODT enable" signal (denoted ODT_EN) which indicates enabling or disabling of on-die termination. The termination control circuit 528A, 528B is configured to respond to assertion of the ODT_EN signal by causing all or less than all of the gate voltages EN_502, EN_504, EN_506, EN_508 to change, thus provoking a change in conductive state of the corresponding one(s) of the MOS transistors 502, 504, 506, 508.

More specifically, when the ODT_EN signal is de-asserted (i.e., when on-die termination is disabled), the termination control circuit 528A, 528B is configured so as to cause the gate voltages EN_502 and EN_504 to be sufficiently high (e.g., $V_{DD}$) so as to ensure that PMOS transistors 502 and 504 are placed in the off state and to cause the gate voltages EN_506 and EN_508 to be sufficiently low (e.g., $V_{SS}$) so as to ensure that NMOS transistors 506 and 508 are placed in the off state. In the off state, each of the MOS transistors 502, 504, 506, 508 effectively acts as an open circuit between the respective first current carrying electrode 502S, 504S, 506S, 508S and the respective second current carrying electrode 502D, 504D, 506D, 508D.

In contrast, when the ODT_EN signal is asserted (i.e., when on-die termination is enabled), the termination control circuit 528A, 528B causes some (or all) of the gate voltages EN_502, EN_504, EN_506, EN_508 to change so as to acquire a level suitable for placing the corresponding MOS transistor in the "ohmic region of operation". By "ohmic region of operation", which can also be referred to as "linear region" or "triode region", is meant a conductive state of a MOS transistor wherein a substantially linear relationship exists between the drain-source voltage drop and the current flowing through the current carrying electrodes (drain and source). Persons skilled in the art will understand that by "substantially linear relationship" one does not require the relationship to be perfectly linear, only that it be more linear than when the MOS transistor is in either an off state or saturation.

The level of the gate voltage suitable for placing a particular MOS transistor in the ohmic region of operation is a function of, among possibly other parameters: (i) whether the particular MOS transistor is an NMOS transistor or a PMOS transistor; (ii) the voltage $V_{TT}$ of power supply 450; and (iii) the threshold voltage of the particular MOS transistor. One can define operation in the ohmic region as taking place when the drain-source voltage drop is less than the gate-source voltage drop minus the threshold voltage. However, this is only one possible definition.

From the above, it will be apparent that the conductive state in which the MOS transistors 502, 504, 506, 508 find themselves at a given point in time may be influenced by the instantaneous voltage at the terminal 14. In particular, for a given MOS transistor operating in the ohmic region of operation, the voltage at the terminal 14 may, during peaks or valleys, occasionally push the given MOS transistor out of the ohmic region and into a different region of operation. This does not constitute an impermissible situation. Overall, it should be appreciated that the level of the gate voltage suitable for placing the given MOS transistor in the ohmic region of operation can be a level that ensures operation in the ohmic region of operation throughout a substantial range of the expected voltage swing of the signal at the terminal 14, and need not guarantee that operation in the ohmic region is maintained continuously throughout the entire expected voltage swing of the signal at the terminal 14.

Thus, for example, when $V_{TT}$=0.9V and the voltage at the terminal 14 is expected to swing between 0.45V and 1.35V, a specific non-limiting example of a gate voltage that places one of the PMOS transistors 502, 504 in the ohmic region of operation is $V_{SS}$=0V (which is also the voltage of power supply 420 that supplies the substrate electrodes 506T, 508T). When the transistor in question is one of the NMOS transistors 506, 508, it can be placed in the ohmic region of operation by setting the gate voltage to $V_{DD}$=1.8V (which is also the voltage of power supply 410 that is supplied to the substrate electrodes 502T, 504T). With such an arrangement, the PMOS and NMOS transistors now operate in the ohmic region of operation throughout a substantial range of the expected voltage swing of the signal at the terminal 14.

It is noted that $V_{TT}$, which was described earlier as being the voltage level of power supply 450, is greater than the gate voltage that places the PMOS transistors 502, 504 in the ohmic region of operation and less than the gate voltage that places the NMOS transistors 506, 508 in the ohmic region of operation. In a specific non-limiting embodiment, $V_{TT}$ can be substantially midway between the two voltages $V_{SS}$ and $V_{DD}$, e.g., $V_{TT}$=0.9 when $V_{SS}$=0V and $V_{DD}$=1.8V. However, this is only one possibility. For example, in an embodiment to be described later with reference to FIGS. 6A and 6B, a PMOS transistor can be placed in the ohmic region of operation by a gate voltage lower than $V_{SS}$, and an NMOS transistor can be placed in the ohmic region of operation by a gate voltage higher than $V_{DD}$. In such a case, $V_{TT}$ is again intermediate the two voltages, and possibly midway, between although this is not a requirement.

It should be appreciated that by using a single power supply at $V_{TT}$ that connects to a current carrying electrode of each of the PMOS transistors 502, 504 and the NMOS transistors 506, 508, the termination circuit 500 consumes less power than a split termination design employing two power supplies at $V_{SS}$ and $V_{DD}$.

It should also be appreciated that a given one of the MOS transistors 502, 504, 506, 508 that is placed in the ohmic region of operation effectively acts as a resistor with a resistance that is approximated by the quotient of the drain-source voltage drop and the current flowing through the current carrying electrodes (drain and source). It is also noted that the path between power supply 450 and terminal 14 (via point/node 18) can be kept free of passive resistors. As such, it will be apparent that conductivity between terminal 14 and power supply 450 (via point/node 18) is attributable in substantial part to those MOS transistors that are placed in the ohmic region of operation (since the MOS transistors in the off state act as open circuits). Additionally, it will be apparent that the electric resistance between terminal 14 and power supply 450 (via point/node 18) is attributable in substantial part to the MOS transistors 502, 504, 506, 508 collectively, regardless of whether they are in an off state (in which case they act as an open circuit) or is placed in the ohmic region of operation (in which case they act as resistors).

It should further be appreciated that placing different subsets of the MOS transistors 502, 504, 506, 508 in the ohmic region of operation allows different electrical resistances to be imparted to the path between terminal 14 and power supply 450. In particular, the termination control circuit 528A, 528B can be used to control the electrical resistance of the path by placing some of the MOS transistors 502, 504, 506, 508 in the ohmic region of operation, while keeping the remaining MOS transistors in the off state. Exactly which subset of the MOS transistors 502, 504, 506, 508 should be placed in the ohmic region of operation can be determined by way of a calibration process, as will now be described.

Figure 3A:
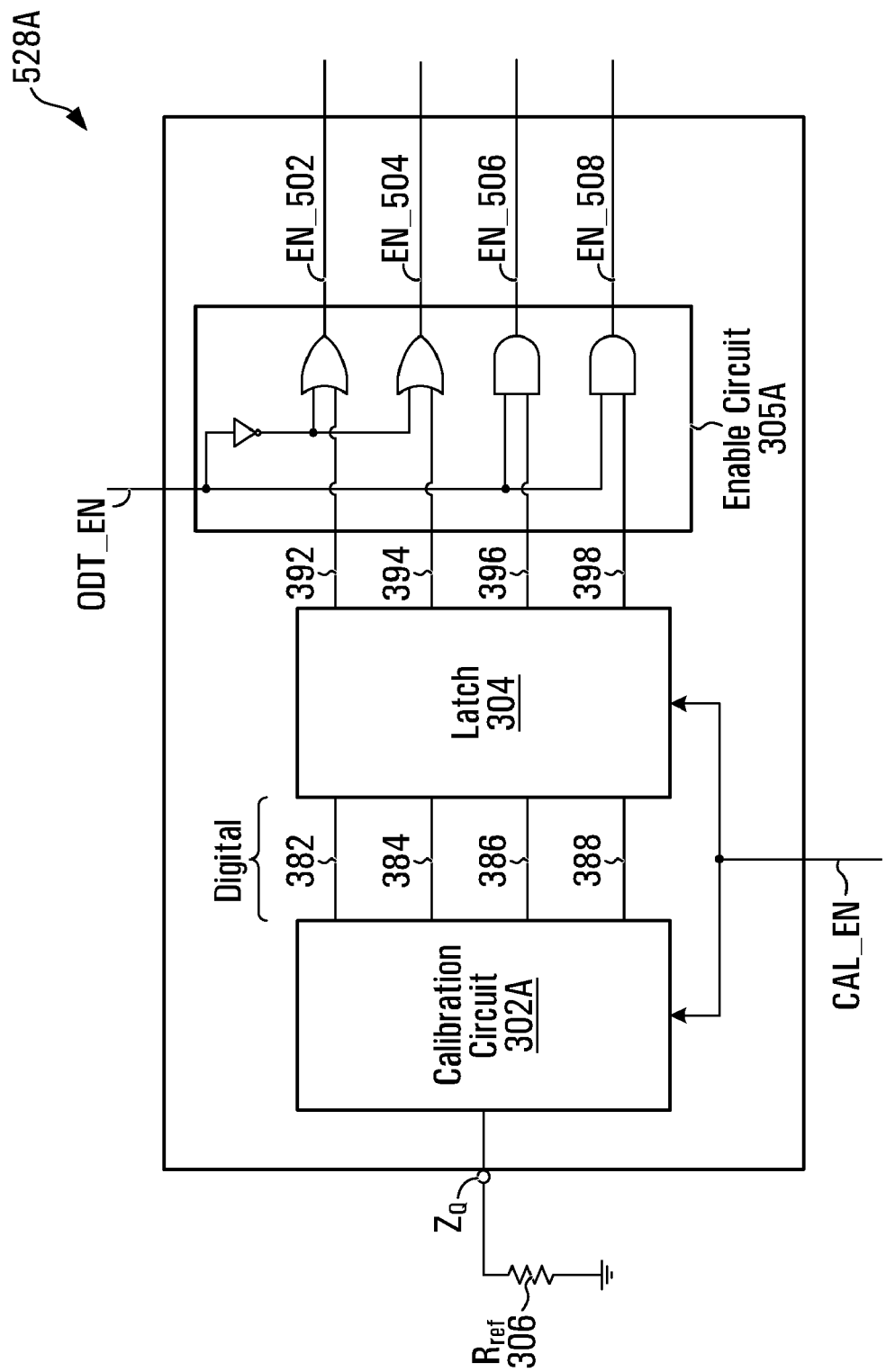
FIG. 3A is a block diagram of a termination control circuit equipped with digital calibration functionality, for use with the termination circuit of FIGS. 1 and 2.

Specifically, with reference to FIG. 3A, in a non-limiting embodiment, the calibration process is digital. That is to say, each of the gate voltages EN_502, EN_504, EN_506, EN_508 provided by termination control circuit 528A varies between a respective first voltage at which the corresponding one of the MOS transistors 502, 504, 506, 508 is placed in the off state, and a respective second voltage at which the corresponding one of the MOS transistors 502, 504, 506, 508 is placed in the ohmic region of operation.

Termination control circuit 528A provides digital calibration functionality using calibration circuit 302A, latch 304 and enable circuit 305A. Calibration circuit 302A is connected to latch 304, which is in turn connected to enable circuit 305A. A reference resistor 306 is shown as being accessed by the calibration circuit 302A through a pin denoted $Z_Q$, although it should be understood that in some embodiments, the reference resistor 306 may be internal to the calibration circuit 302A or may even be omitted. The reference resistor 306 represents the desired termination resistance to be achieved by the termination circuit 500, and is a design parameter. Alternatively, the reference resistor 306 may represent a multiple or fraction of the desired termination resistance to be achieved by the termination circuit 500, and the calibrated ODT resistance will be scaled accordingly. The calibration circuit 302A receives a "calibration enable" (CAL_EN) signal from a controller (not shown) which can be asserted to indicate a desire of such controller to carry out a calibration process using the calibrator circuitry 302A. Specifically, responsive to assertion of the CAL_EN signal, the calibrator circuitry 302A attempts to find a subset of the MOS transistors 502, 504, 506, 508 which, when placed in the ohmic region of operation, imparts a resistance (from the perspective of terminal 14) that best approximates the resistance of the reference resistor 306.

To this end, the calibration circuit 302A may comprise internal resistive devices (e.g., replica resistors) that are designed to have the same resistance as the MOS transistors 502, 504, 506, 508 when these are placed in the ohmic region of operation. The calibration circuit 302A identifies a subset of the internal replica resistors whose collective resistance matches that of the reference resistor 306. This can be in an iterative fashion, starting with an initial subset of the internal replica resistors and ending with a final, selected subset of the internal replica resistors.

In an alternative embodiment, the calibration circuit 302A includes or otherwise has access to a look-up table (not shown) that stores data regarding the resistance values of the various MOS transistors 502, 504, 506, 508, were they to be placed in the ohmic region of operation. In such an embodiment, the calibration circuit 302A obtains the resistance of the reference resistor 306 (either by receiving a value from an external source or by measuring it directly), and then identifies a subset of resistance values (i.e., a subset of individual MOS transistors) that results in a satisfactory numerical match with respect to the resistance of the reference resistor 306.

Other ways of achieving resistance matching will become apparent to those of skill in the art.

It should be appreciated that the subset of MOS transistors ultimately identified includes at least one NMOS transistor and at least one PMOS transistor, and may include up to and including all of the MOS transistors between node 18 and power supply 450.

The calibration circuit 302A provides latch 304 with a plurality of digital calibration signals 382, 384, 386, 388, respectively corresponding to the MOS transistors 502, 504, 506, 508. The digital calibration signal corresponding to a particular MOS transistor will be at a voltage level that depends on (i) whether the particular MOS transistor is an NMOS or a PMOS device, and (ii) whether the particular MOS transistor is to be placed in the ohmic region of operation, as determined by the calibration circuit 302A. For example, the digital calibration signal for a PMOS transistor that is to be placed in the off state can be set to $V_{DD}$, the digital calibration signal for a PMOS transistor that is to be placed in the ohmic region of operation can be set to $V_{SS}$, the digital calibration signal for an NMOS transistor that is to be placed in the off state can be set to $V_{SS}$, and the digital calibration signal for an NMOS transistor that is to be placed in the ohmic region of operation can be set to $V_{DD}$.

Latch 304 latches the values of the digital calibration signals 382, 384, 386, 388 received from the calibration circuit 302A and transfers them to enable circuit 305A in the form of latched digital calibration signals 392, 394, 396, 398. The latching operation of latch 304 can be triggered by de-assertion of the CAL_EN signal. The latched digital calibration signals 392, 394, 396, 398 will retain the same voltage levels until the CAL_EN signal is asserted and then de-asserted again, for example, during a subsequent iteration of the calibration process. Thus, use of the latch 304 allows the calibration circuit 302A to be disabled until needed again, thus the calibration circuit 302A does not unnecessarily dissipate current when it is not being used. Rather, the levels of the latched digital calibration signals 392, 394, 396, 398 are retained by latch 304, which is simple to implement and has low power consumption.

Within enable circuit 305A, each of the latched digital calibration signals 392, 394, 396, 398 is received and logically combined (for example, using a combination of logic AND and logic OR gates) with the ODT_EN signal to yield a corresponding one of the gate voltages EN_502, EN_504, EN_506, EN_508. Specifically, when the ODT_EN signal goes high to indicate that on-die termination is enabled, the latched digital calibration signals 392, 394, 396, 398 are transferred unchanged through the enable circuit 305A to gate voltages EN_502, EN_504, EN_506, EN_508. Thus, where the latched digital calibration signal corresponding to a particular one of the MOS transistors is at a level suitable for placing that MOS transistor in the off state, the gate voltage destined for that MOS transistor will acquire this same level. Similarly, where the latched digital calibration signal corresponding to a particular one of the MOS transistors is at a level suitable for placing that MOS transistor in the ohmic region of operation, the gate voltage destined for that MOS transistor will acquire this same level.

On the other hand, when the ODT_EN signal goes low to indicate that on-die termination is disabled, all of the gate voltages EN_502, EN_504, EN_506, EN_508 are forced to a level suitable for placing the corresponding MOS transistors in the off state, namely $V_{SS}$ (in the case of an NMOS transistor) or $V_{DD}$ (in the case of a PMOS transistor). Stated differently, the level of any of the latched digital calibration signals 392, 394, 396, 398 received from the calibration circuit 302A is overridden by disabling on-die termination.

It should be appreciated that the subset of MOS transistors placed in the ohmic region through action of the termination control circuit 528A when on-die termination is enabled includes at least one NMOS transistor and at least one PMOS transistor, and may include up to and including all of the MOS transistors between node 18 and power supply 450.

Figure 3B:
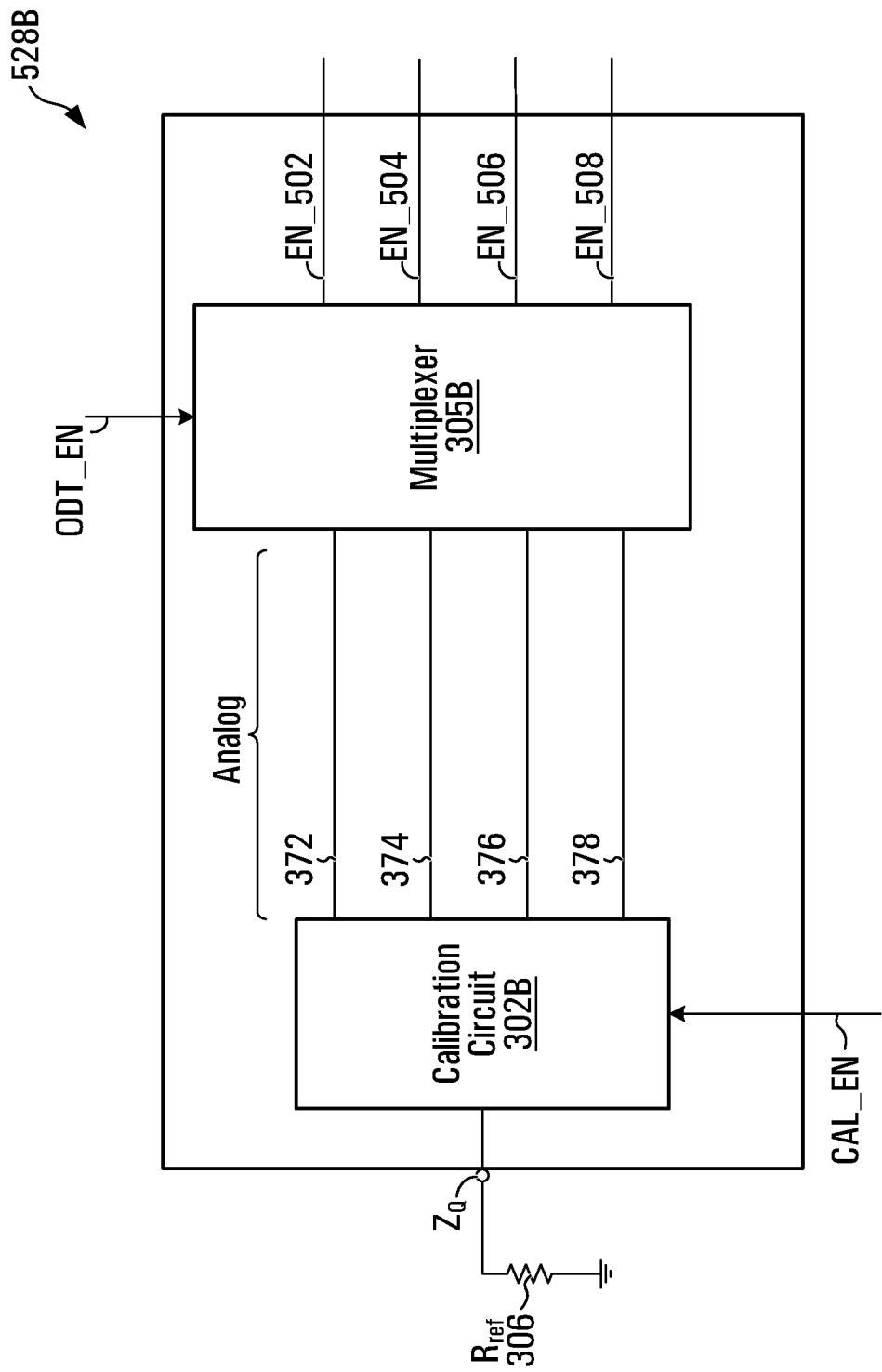
FIG. 3B is a block diagram of a termination control circuit equipped with analog calibration functionality, for use with the termination circuit of FIGS. 1 and 2.

With reference now to FIG. 3B, in another non-limiting embodiment, the calibration process is analog. That is to say, each of the gate voltages EN_502, EN_504, EN_506, EN_508 provided by termination control circuit 528B varies between a respective first voltage at which the corresponding one of the MOS transistors 502, 504, 506, 508 is placed in the off state, and a respective range of second voltages within which the gate voltages EN_502, EN_504, EN_506, EN_508 can vary stepwise or continuously to as to provide a fine-tuned resistance. Specifically, when a given one of the gate voltages EN_502, EN_504, EN_506, EN_508 is in the respective range of second voltages, the corresponding one of the MOS transistors 502, 504, 506, 508 is placed in the ohmic region of operation and imparts a variable resistance that depends on the value of the given one of the gate voltages EN_502, EN_504, EN_506, EN_508. Thus, the resistance of each of the MOS transistors 502, 504, 506, 508 can be controlled to a certain degree of precision.

Termination control circuit 528B provides analog calibration functionality using calibration circuit 302B. The aforementioned reference resistor 306 is shown as being accessed by the calibration circuit 302B through the aforementioned pin denoted $Z_Q$, although it should be understood that in some embodiments, the reference resistor 306 may be internal to the calibration circuit 302B or may even be omitted. The reference resistor 306 represents the desired termination resistance to be achieved by the termination circuit 500, and is a design parameter. The calibration circuit 302B receives the aforementioned CAL_EN signal from a controller (not shown) which can be asserted to indicate a desire of such controller to carry out a calibration process using the calibration circuit 302B. Specifically, responsive to assertion of the CAL_EN signal, the calibration circuit 302B attempts to find a subset of the MOS transistors 502, 504, 506, 508 which, when placed in the ohmic region of operation, can be made to collectively impart a resistance (from the perspective of node 18) that best approximates the resistance of the reference resistor 306.

To this end, the calibration circuit 302B may comprise calibration circuit elements that have the same resistance behavior as a function of an applied voltage as the MOS transistors 502, 504, 506, 508 have as a function of the gate voltages EN_502, EN_504, EN_506, EN_508, respectively. The calibration circuit 302B identifies which applied voltages, when applied to the calibration circuit elements, yield a collective resistance that matches the resistance of the reference resistor 306. This can be done in an iterative fashion, starting with an initial subset of applied voltages and ending with a final subset of applied voltages. The applied voltages in the final subset are output to multiplexer 305B in the form of analog calibration voltages 372, 374, 376, 378, respectively corresponding to the MOS transistors 502, 504, 506, 508.

In an alternative embodiment, the calibration circuit 302B includes or otherwise has access to a look-up table (not shown) that stores data regarding the resistance behaviour as a function of gate voltage of the various MOS transistors 502, 504, 506, 508, particularly in the ohmic region of operation. In such an embodiment, the calibration circuit 302B provides processing functionality. Specifically, once the calibration circuit 302B obtains the resistance of the reference resistor 306 (either by receiving a value from an external source or by measuring it directly), the calibration circuit 302B consults the look-up table to determine the gate voltage that should be applied to each of the MOS transistors 502, 504, 506, 508 so as to achieve a satisfactory match with respect to the resistance of the reference resistor 306. The gate voltages so determined are output to the multiplexer 305B in the form of the analog calibration voltages 372, 374, 376, 378.

Other ways of achieving resistance matching will become apparent to those of skill in the art.

It should be appreciated that the analog calibration voltage corresponding to a particular MOS transistor among the MOS transistors 502, 504, 506, 508 will be at a voltage level that depends on (i) whether the particular MOS transistor is an NMOS or a PMOS device, (ii) whether the particular MOS transistor is to be placed in the ohmic region of operation and (iii) assuming the particular MOS transistor is indeed to be placed in the ohmic region of operation, the precise resistance sought to be imparted by the particular MOS transistor. For example, the analog calibration voltage for a PMOS transistor that is to be placed in the off state can be set to $V_{DD}$, the analog calibration voltage for a PMOS transistor that is to be placed in the ohmic region of operation can be set within a range bounded by $V_{S1}$ and $V_{S2}$ (which may or may not include $V_{SS}$), the analog calibration voltage for an NMOS transistor that is to be placed in the off state can be set to $V_{SS}$, and the analog calibration voltage for an NMOS transistor that is to be placed in the ohmic region of operation can be set to within a range bounded by $V_{D1}$ and $V_{D2}$ (which may or may not include $V_{DD}$).

The analog calibration voltages 372, 374, 376, 378 are selectively switched depending on the state of the ODT_EN signal within multiplexer 305B to yield a corresponding one of the gate voltages EN_502, EN_504, EN_506, EN_508. Specifically, when the ODT_EN signal goes high to indicate that on-die termination is enabled, the analog calibration voltages 372, 374, 376, 378 are transferred unchanged through the multiplexer 305B to gate voltages EN_502, EN_504, EN_506, EN_508. Thus, where the analog calibration voltage corresponding to a particular one of the MOS transistors 502, 504, 506, 508 is at a level suitable for placing that MOS transistor in the off state, the gate voltage destined for that MOS transistor will acquire this same level. Similarly, where the analog calibration voltage corresponding to a particular one of the MOS transistors 502, 504, 506, 508 is at a level suitable for placing that MOS transistor in the ohmic region of operation so as to impart a certain desired resistance, the gate voltage destined for that MOS transistor will acquire this same level.

On the other hand, when the ODT_EN signal goes low to indicate that on-die termination is disabled, all of the gate voltages EN_502, EN_504, EN_506, EN_508 are forced to a level suitable for placing the corresponding MOS transistors in the off state, namely $V_{SS}$ (in the case of an NMOS transistor) or $V_{DD}$ (in the case of a PMOS transistor). Stated differently, the level of any of the analog calibration voltages 372, 374, 376, 378 received from calibration circuit 302B is overridden by disabling on-die termination. It should be appreciated that calibration circuit 302B and multiplexer 305B need not be separate and indeed may be combined into a single module.

Figure 3C:
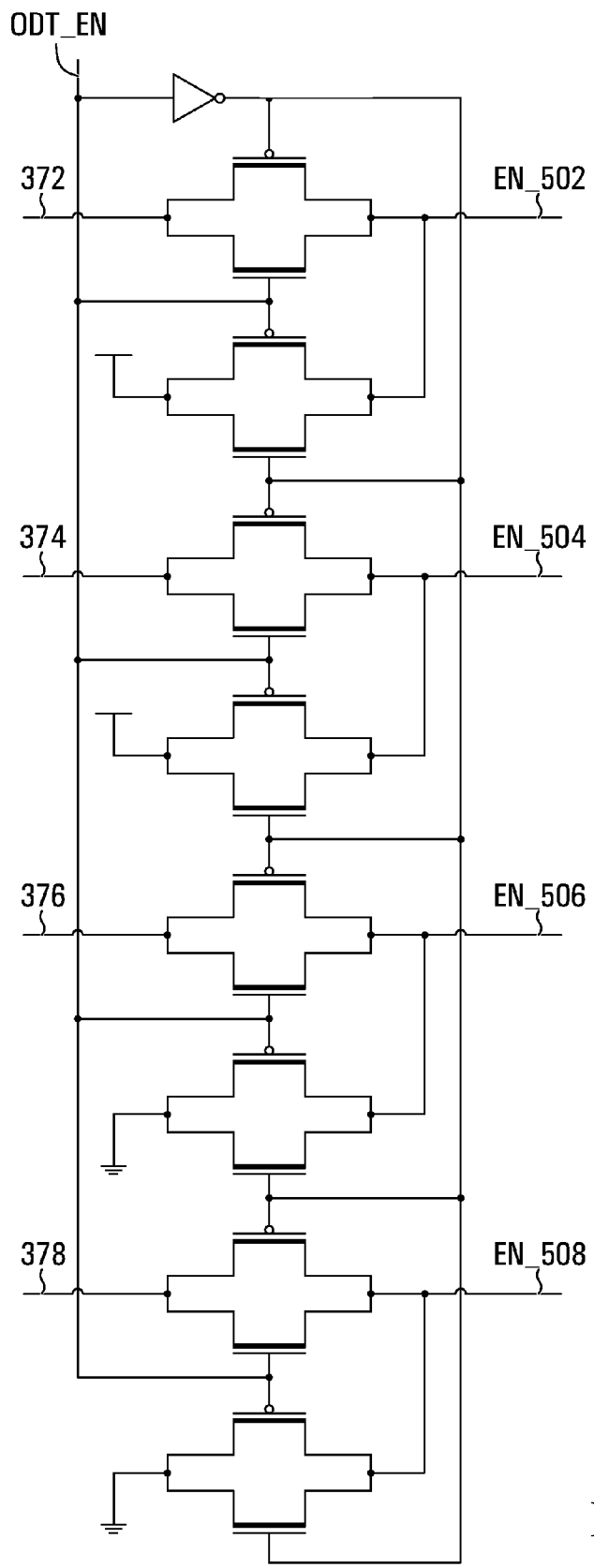
FIG. 3C is a circuit diagram of a multiplexer that can be used in the termination control circuit of FIG. 3B.

As a non-limiting example, multiplexer 305B may be implemented with CMOS transmission gates comprised of pairs of parallel NMOS and PMOS transistors as shown in FIG. 3C. For the case where analog calibration voltages 372, 374, 376, 378 range between $V_{SS}$ and $V_{DD}$, the PMOS transistor substrates (not shown) can be tied to $V_{DD}$, the NMOS transistor substrates (not shown) can be tied to $V_{SS}$, and the inverter can be powered by $V_{SS}$ and $V_{DD}$. When the ODT_EN signal is low, the output of the inverter will be high, and the transmission gates connected between analog calibration voltages 372, 374, 376, 378 and gate voltages EN_502, EN_504, EN_506, EN_508 will be off, since the NMOS transistor in each transmission gate will have a low gate voltage, and the PMOS transistor in each transmission gate will have a high gate voltage. At the same time the transmission gates connected between fixed $V_{SS}$ and $V_{DD}$ levels and gate voltages EN_502, EN_504, EN_506, EN_508 will be on, since the NMOS transistor in each transmission gate will have a high gate voltage, and the PMOS transistor in each transmission gate will have a low gate voltage. High gate voltages EN_502, EN_504 disable PMOS termination transistors 502, 504. Low gate voltages EN_506, EN_508 disable NMOS termination transistors 506, 508.

When the ODT_EN signal is high, the output of the inverter will be low, and the transmission gates connected between analog calibration voltages 372, 374, 376, 378 and gate voltages EN_502, EN_504, EN_506, EN_508 will be turned on, since the NMOS transistor in each transmission gate will have a high gate voltage, and the PMOS transistor in each transmission gate will have a low gate voltage. At the same time the transmission gates connected between fixed $V_{SS}$ and $V_{DD}$ levels and gate voltages EN_502, EN_504, EN_506, EN_508 will be off, since the NMOS transistor in each transmission gate will have a low gate voltage, and the PMOS transistor in each transmission gate will have a high gate voltage. Analog calibration voltages 372, 374, 376, 378 are provided to termination transistors 502, 504, 506, 508 to enable on-die termination.

It should be appreciated that the subset of MOS transistors placed in the ohmic region through action of the termination control circuit 528B when on-die termination is enabled includes at least one MOS transistor, either a single PMOS transistor or a single NMOS transistor, and may include up to and including all of the MOS transistors between node 18 and power supply 450. Although a single transistor or a plurality of transistors of a single type, either NMOS or PMOS, may be provided, it is possible to provide a plurality of transistors including at least one NMOS transistor and at least one PMOS transistor. As the voltage on terminal 14 varies between a high and low voltage, an NMOS transistor may fall out of linear operation towards one end of the range while a PMOS transistor will fall out of linear operation towards the other end of the range. If NMOS and PMOS transistors are provided and calibrated to have similar or equal resistances at the midpoint of the range of voltages on terminal 14, the non-linearity effects at either of the extremes of the range can reduced.

It should also be appreciated that in some embodiments, a hybrid analog/digital approach can be used, with the effect that certain ones of the gate voltages EN_502, EN_504, EN_506, EN_508 may be derived from digital calibration signals and certain other ones of the gate voltages EN_502, EN_504, EN_506, EN_508 may be derived from analog calibration signals.

Figure 4A:
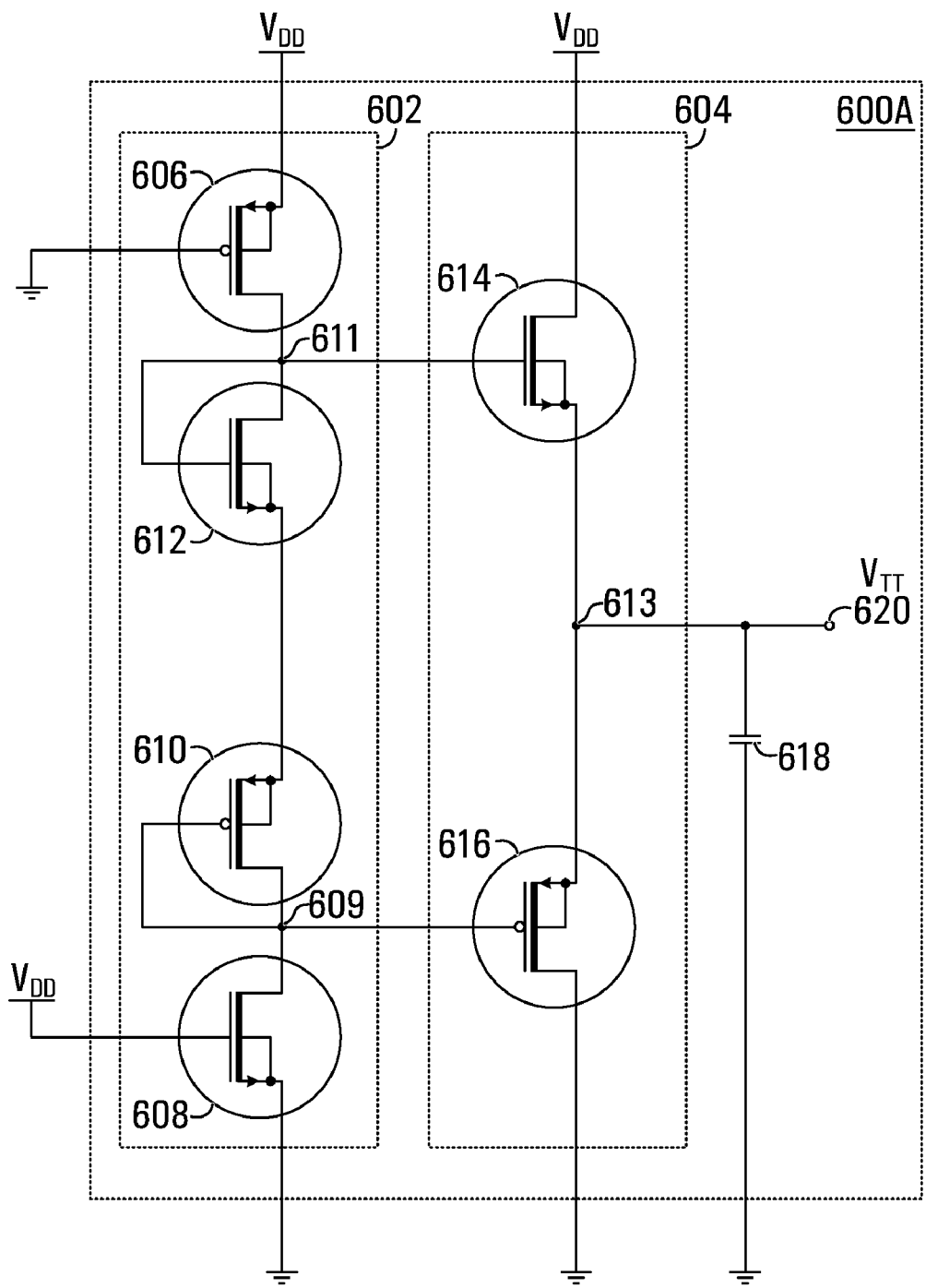
FIGS. 4A and 4B are circuit diagrams of a voltage generator for generating a voltage that can be supplied to the termination circuit of FIGS. 1 and 2.
Figure 4B:
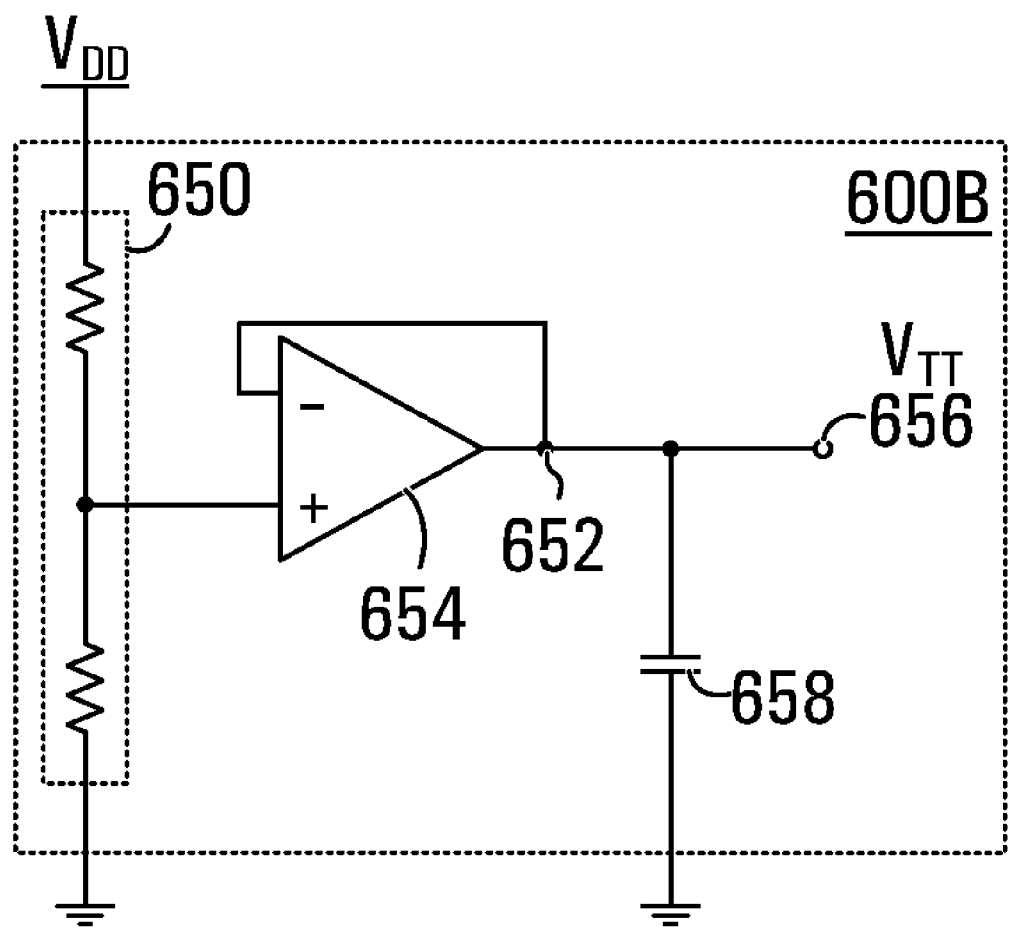

Reference is now made to FIGS. 4A and 4B, which show example on-chip voltage generators 600A, 600B for generating the voltage $V_{TT}$ from available voltage supplies at $V_{DD}$ and $V_{SS}$, in the specific non-limiting example where $V_{SS}=0V$ (ground) and $V_{TT}=\frac{1}{2}V_{DD}$. In FIG. 4A, voltage generator 600A includes a bias stage 602 and an output stage 604. Bias stage 602 includes a PMOS device 606 with its gate wired to ground and an NMOS device 608 with its gate wired to $V_{DD}$. Between the two devices are connected a further PMOS device 610 and a further NMOS device 612. PMOS device 610 has its gate wired to junction 609 situated between its source and the drain of NMOS device 608, while NMOS device 612 has its gate wired to junction 611 situated between its drain and the source of PMOS device 606. The output stage 604 includes an NMOS device 614 and a PMOS device 616 connected in series between $V_{DD}$ and ground. A $V_{TT}$ node 620 is located at junction 613 situated between NMOS device 614 and PMOS device 616, while an output capacitance 618 shunts the $V_{TT}$ node 620 to ground.

The illustrated voltage generator 600A has the benefit that current through the bias stage 602 and the output stage 604 is relatively low while $V_{TT}$ is at the desired $\frac{1}{2}V_{DD}$ level. PMOS device 606 with its gate wired to ground and NMOS device 608 with its gate wired to $V_{DD}$ serve as resistors to limit the current within the bias stage 602. Moreover, the output stage 604 draws relatively little current while $V_{TT}$ is at the desired $\frac{1}{2}V_{DD}$ level because NMOS device 614 and PMOS device 616 each have a gate-source bias of approximately $V_T$, namely the threshold voltage. Once the output at the $V_{TT}$ node 620 moves away from the desired $\frac{1}{2}V_{DD}$ level, the gate-source bias of one of the output devices 614, 616 increases to provide a larger current to restore the output level to $\frac{1}{2}V_{DD}$. The output capacitance 618 is provided as a reservoir and can be made sufficiently large to supply instantaneous current demands on the $V_{TT}$ node 620. Optionally, voltage generator 600A may share a common bias stage with other voltage sources on the semiconductor device, which for a memory chip could include a source at $V_{CP}$ (cell plate voltage) and/or a source at $V_{BLP}$ (bitline precharge voltage).

In voltage generator 600B of FIG. 4B, a bias chain 650 (implemented as a resistor divider) sets a node 652 at a reference level. The voltage at the node 652 is buffered by an operational amplifier 654 in a unity gain configuration. A $V_{TT}$ node 656 is located at the output of the operational amplifier 654, and is shunted to ground by an output capacitance 658. In some embodiments, the operational amplifier 654 has a class B or class AB output stage where quiescent current is much smaller than the active current that flows to its output when $V_{TT}$ diverges from the desired reference level. In addition to providing the dominant pole for closed loop stability, the output capacitance 658 can be made sufficiently large to supply instantaneous current demands on the $V_{TT}$ node 656. In other words, the output capacitance 658 allows the circuitry 600B to supply sufficient current to maintain the $V_{TT}$ node 656 at the proper level (in this case, $V_{TT}=\frac{1}{2}V_{DD}$) even in the worst case scenario when all terminals (such as the terminal 14) are continuously receiving '0's or are continuously receiving '1's. Thus, a separate compensation capacitor internal to the operational amplifier 654 is not required. For the in-between scenarios when some inputs are receiving '1' and others are receiving '0', the input currents will actually cancel out at the $V_{TT}$ node 656 and the current drive requirements of the operational amplifier 654 will be lower.

Figure 5:
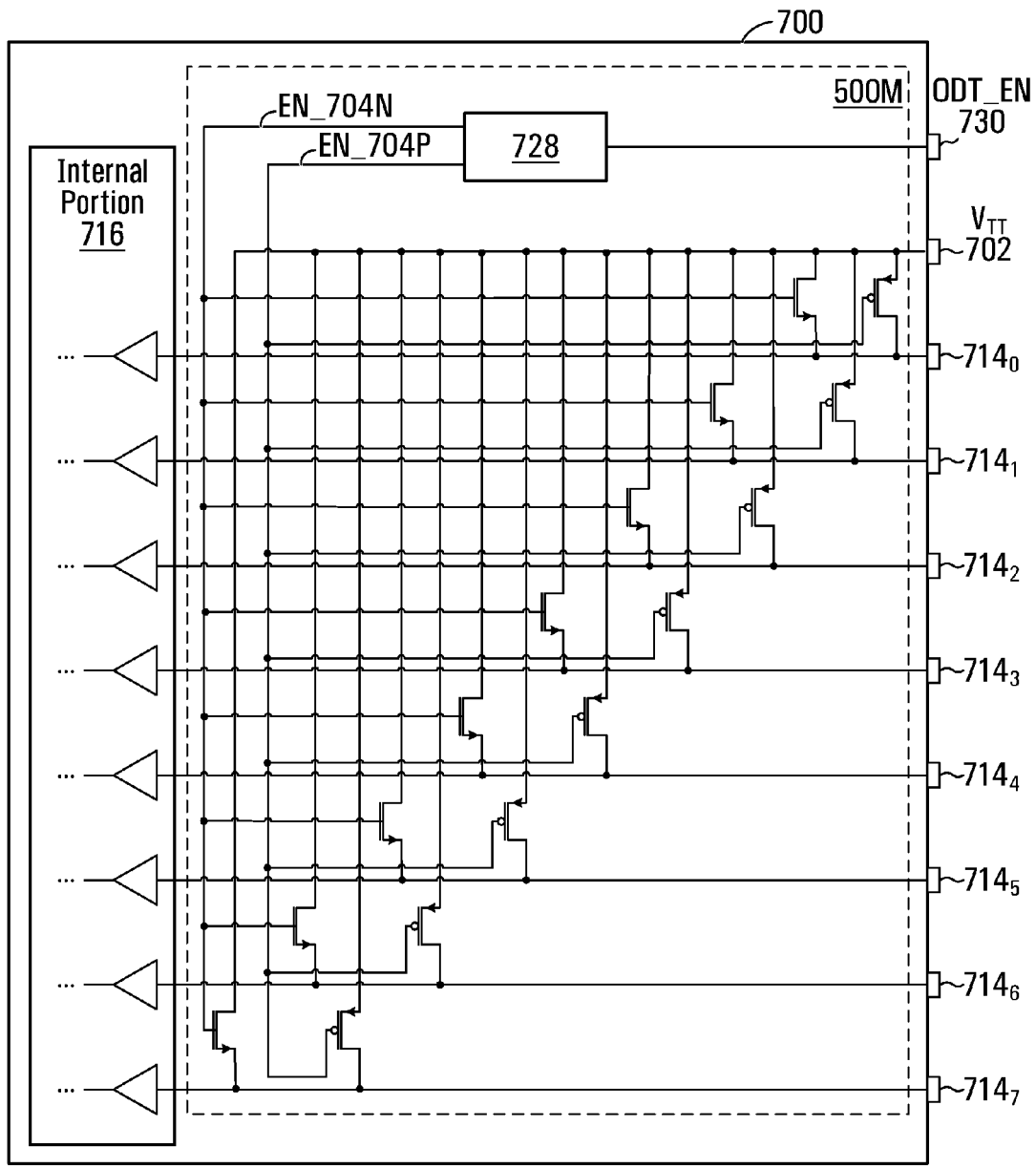
FIG. 5 is a circuit diagram of a termination circuit for providing on-die termination for a plurality of terminals of a semiconductor device, in accordance with a specific non-limiting embodiment of the present invention.

It should be appreciated that the above embodiments, which have been described in the context of a single terminal 14, are also applicable in the context of multiple terminals, be they input terminals, output terminals, input/output terminals or a combination thereof. In particular, and with reference to FIG. 5, there is shown a schematic diagram of a semiconductor device 700 in accordance with another example embodiment. The illustrated semiconductor device 700 has an 8-bit databus with 8 data terminals $714_0 \ldots 714_7$ connected to input buffers leading to an internal portion 716. Those skilled in the art will appreciate that the databus can be bidirectional; however for simplicity output buffers are not shown in FIG. 5.

Semiconductor device 700 comprises a termination circuit 500M connected between the plurality of data terminals $714_0 \ldots 714_7$ and the internal portion 716 of the semiconductor device 700. Termination circuit 500M includes a plurality of NMOS termination transistors 704N and a plurality of PMOS termination transistors 704P. NMOS termination transistors 704N and PMOS termination transistors 704P each include a source and a drain, one of which is connected to the junction between the internal portion 716 and a corresponding one of the data terminals $714_0 \ldots 714_7$. The other of the source and the drain is connected to a common pin 702 which supplies the aforementioned voltage $V_{TT}$ for on-die termination. In other embodiments, the voltage $V_{TT}$ may be generated on-chip as previously described with reference to FIGS. 4A and 4B, for example.

Termination circuit 500M comprises control circuit 728, which disables and enables on-die termination functionality based on an ODT_EN signal. The ODT_EN signal can be provided to control circuit 728 via a pin 730 of the semiconductor device 700. In a non-limiting example, on-die termination may be enabled when the semiconductor 700 is in receiving mode but disabled when the semiconductor device 700 is driving the terminals 714.

Based on the level of the ODT_EN signal, control circuit 728 sets the level of a gate voltage EN_704N fed to the gate of each of the NMOS termination transistors 704N and the level of a gate voltage EN_704P fed to the gate of each of the PMOS termination transistors 704P. Specifically, when the ODT_EN signal is de-asserted, control circuit 728 causes the gate voltage EN_704N to take on a level that ensures that the NMOS termination transistors 704N are placed in the off state, an example of such a level being $V_{SS}$. Control circuit 728 also causes the gate voltage EN_704P to take on a level that ensures that the PMOS termination transistors 704P are placed in the off state, an example of such a level being $V_{DD}$.

In contrast, when the ODT_EN signal is asserted, control circuit 728 causes the gate voltage EN_704N to take on a level that ensures that the NMOS termination transistors 704N are placed in the ohmic region of operation. In some embodiments, an example of such a level is a fixed voltage such as $V_{DD}$. In other embodiments, an example of such a level varies within a range bound by $V_{D1}$ and $V_{D2}$, allowing the NMOS termination transistors 704N to impart a variable resistance. Control circuit 728 also causes the gate voltage EN_704P to take on a level that ensures that the PMOS termination transistors 704P are placed in the ohmic region of operation. In some embodiments, an example of such a level is a fixed voltage such as $V_{SS}$. In other embodiments, an example of such a level varies within a range bound by $V_{S1}$ and $V_{S2}$, allowing the PMOS termination transistors 704P to impart a variable resistance.

It should be appreciated that in the aforementioned example, both termination transistors connected to each data terminal were placed in the ohmic region of operation when on-die termination was enabled. However, it should be appreciated that in some embodiments, there may be multiple mixed PMOS and NMOS termination transistors connected to one or more data terminals, in which case it may be desirable to identify which subset of these termination transistors should be placed in the ohmic region of operation so as to achieve a desired termination resistance value.

It should be appreciated that in each of the above embodiments, the size of the MOS transistors can be reduced while still imparting the desired resistance. In particular, it is remarked that when a MOS transistor is placed in the ohmic region of operation, the current through the drain (denoted $I_D$) is approximately related to the drain-source voltage drop (denoted $V_{DS}$) and the gate-source voltage drop (i.e., the gate voltage, denoted $V_{GS}$) by the following equation (see page 310 of Microelectronic Circuits, Third Edition, by Adel S. Sedra and Kenneth C. Smith, Saunders College Publishing, 1991, hereby incorporated by reference herein):

$$I_D = 2K(V_{GS} - V_T)V_{DS},$$

where $V_T$ is the threshold voltage of the MOS transistor in question and K is a device parameter given by:

$$K = \tfrac{1}{2}\mu_n C_{OX}(W/L),$$

where $\mu_n$ is the "electron mobility", $C_{OX}$ is the "oxide capacitance", L is the channel length of the MOS transistor and W is the channel width of the MOS transistor. Thus, the resistance imparted by the MOS transistor, which is expressed as $R_{MOS} = V_{DS}/I_D$, equals to:

$$R_{MOS} = V_{DS}/I_D = (2K(V_{GS}-V_T))^{-1} = L/(\mu_n \cdot C_{OX} \cdot W \cdot (V_{GS} - V_T)).$$

Thus, $R_{MOS}$ is inversely proportional to both the channel width W and the gate voltage $V_{GS}$. It follows that while keeping the same gate-source voltage $V_{GS}$, it is possible to achieve a larger resistance by a smaller MOS transistor. Conversely, a desired resistance can be achieved using a smaller MOS transistor by supplying a greater gate-source voltage $V_{GS}$. By "smaller" MOS transistor, it is contemplated that the channel width W may be shrunk, while the channel length L is kept constant for ESD (Electro-Static Discharge) protection considerations. However, this is only one example way in which to reduce the size of a MOS transistor.

Thus, the trade-off for using smaller MOS transistors for providing a desired resistance when in the ohmic region of operation is the need to supply a stronger voltage at the gate. For an NMOS transistor, this translates into supplying a gate voltage greater than $V_{DD}$ (while the substrate electrode is at $V_{SS}$) and for a PMOS transistor, this translates into supplying a gate voltage less than $V_{SS}$ (while the substrate electrode is at $V_{DD}$).

In some embodiments, a dedicated power supply can be provided for generating these stronger gate voltages. However, in other embodiments, existing power supplies that are already at the stronger voltages can be re-used. This is the case with certain memory modules comprising an array of memory cells accessed through wordlines and bitlines. In such a case, an example of a voltage above $V_{DD}$ that may be re-used is the $V_{PP}$ power supply that is otherwise employed for activating wordlines in a DRAM, and an example of a voltage below power supply that may be re-used is the $V_{BB}$ supply that is otherwise employed for cell substrate back-bias in a DRAM. Other possibilities exist and are within the scope of embodiments of the present invention.

Having established the desirability, in some circumstances, of supplying gate voltages with a dynamic range that exceeds that which exists between $V_{SS}$ and $V_{DD}$, there are various ways of achieving this. For example, from a power conservation point of view, it may be desirable to proceed with a two-step process, whereby the gate voltages are first generated as previously described in the case of termination control circuit 528A (namely, with a dynamic range of $V_{SS}$ to $V_{DD}$), and then the dynamic range of the gate voltages is augmented using level shifters. Specifically, level shifters such as the one shown at 802 in FIG. 6A can be inserted in the paths between termination control circuit 528A and the gates of PMOS transistors 502, 504 in FIGS. 1 and 2. Similarly, level shifters such as the one shown at 852 in FIG. 6B can be inserted in the paths between termination control circuit 528A and the gates of NMOS transistors 506, 508. It should be appreciated that the level shifters can be inserted in the paths between termination control circuit 528A and all of the transistors 502, 504, 506, 508 or only a subset of the transistors 502, 504, 506, 508. Thus, it is possible that transistors of the same type (e.g., NMOS or PMOS) are provided with different gate voltages that place those transistors in the ohmic region of operation.

Figure 6A:
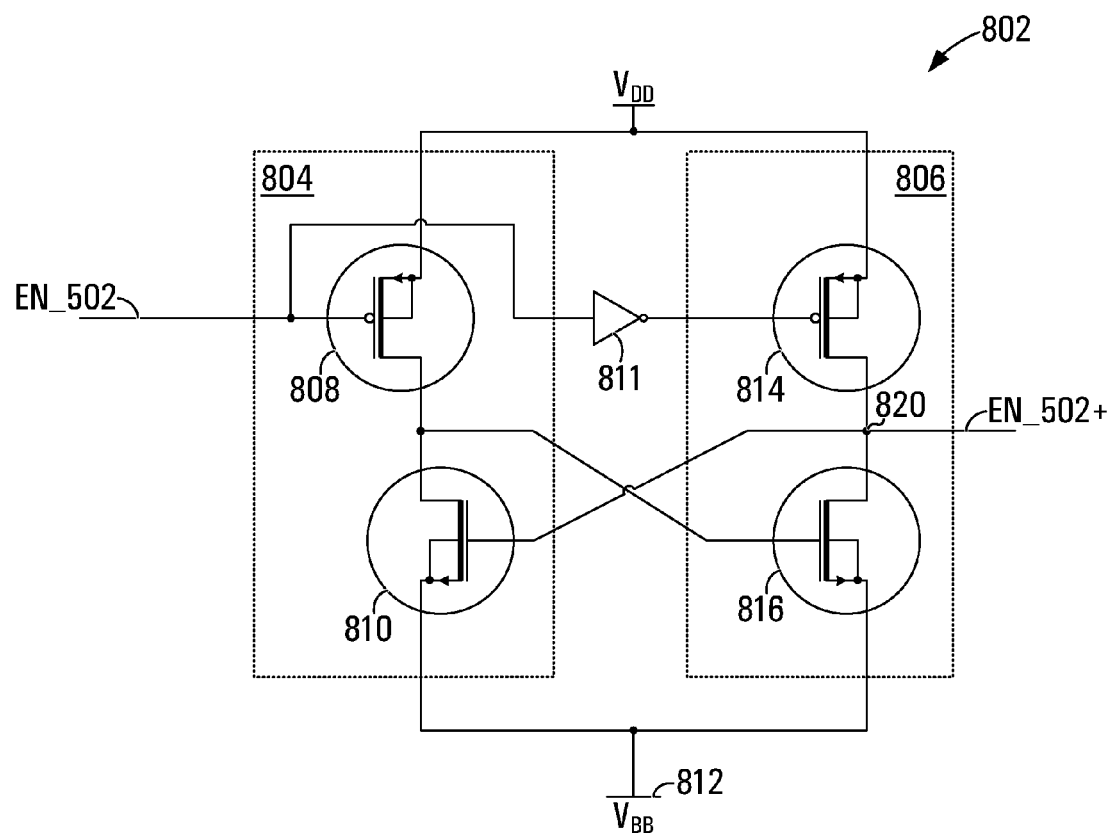
FIGS. 6A and 6B are circuit diagrams showing complementary versions of a level shifter that can be used to expand the range of a voltage signal, in accordance with specific non-limiting embodiments of the present invention.

In the example embodiment shown in FIG. 6A, level shifter 802 converts an input voltage EN_502 (which is assumed to be a binary signal having a level that is either $V_{SS}$ or $V_{DD}$) into a level shifted output voltage EN_502+ (which will be a binary signal having a level that is either $V_{BB}$ or $V_{DD}$). Here, $V_{BB}$ represents a voltage level that is lower than $V_{SS}$. In a non-limiting example, $V_{SS}$ may be 0V and $V_{BB}$ may be −1.0V. Other possibilities exist and are contemplated as being within the scope of certain embodiments of the present invention.

Specifically, level shifter 802 comprises two interconnected branches of MOS transistors 804, 806. The first branch 804 comprises PMOS transistor 808 whose gate receives input voltage EN_502. The source of PMOS transistor 808 is connected to power supply $V_{DD}$ and the drain of PMOS transistor 808 is connected to the drain of NMOS transistor 810. The source of NMOS transistor 810 is connected to power supply 812 at a voltage $V_{BB} < V_{SS}$. The second branch 806 comprises PMOS transistor 814 whose source is also connected to $V_{DD}$ and whose drain is connected to the drain of NMOS transistor 816. The source of NMOS transistor 816 is connected to power supply 812 at voltage $V_{BB}$. The gate of PMOS transistor 814 is connected to the output of inverter 811 which inverts the input voltage EN_502. Also, the gate of NMOS transistor 810 in the first branch 804 is connected to the drain of NMOS transistor 816 in the second branch 806. In addition, the gate of NMOS transistor 816 in the second branch 806 is connected to the drain of NMOS transistor 810 in the first branch 804. Finally, the level shifted output voltage EN_502+ is taken at node 820 between the drain of PMOS transistor 814 and the drain of NMOS transistor 816. Those skilled in the art will thus appreciate from FIG. 6A that when input voltage EN_502 is at $V_{SS}$, the level shifted output voltage EN_502+ is at $V_{BB}$, and when input voltage EN_502 is at $V_{DD}$, the level shifted output voltage EN_502+ is at $V_{DD}$.

Figure 6B:
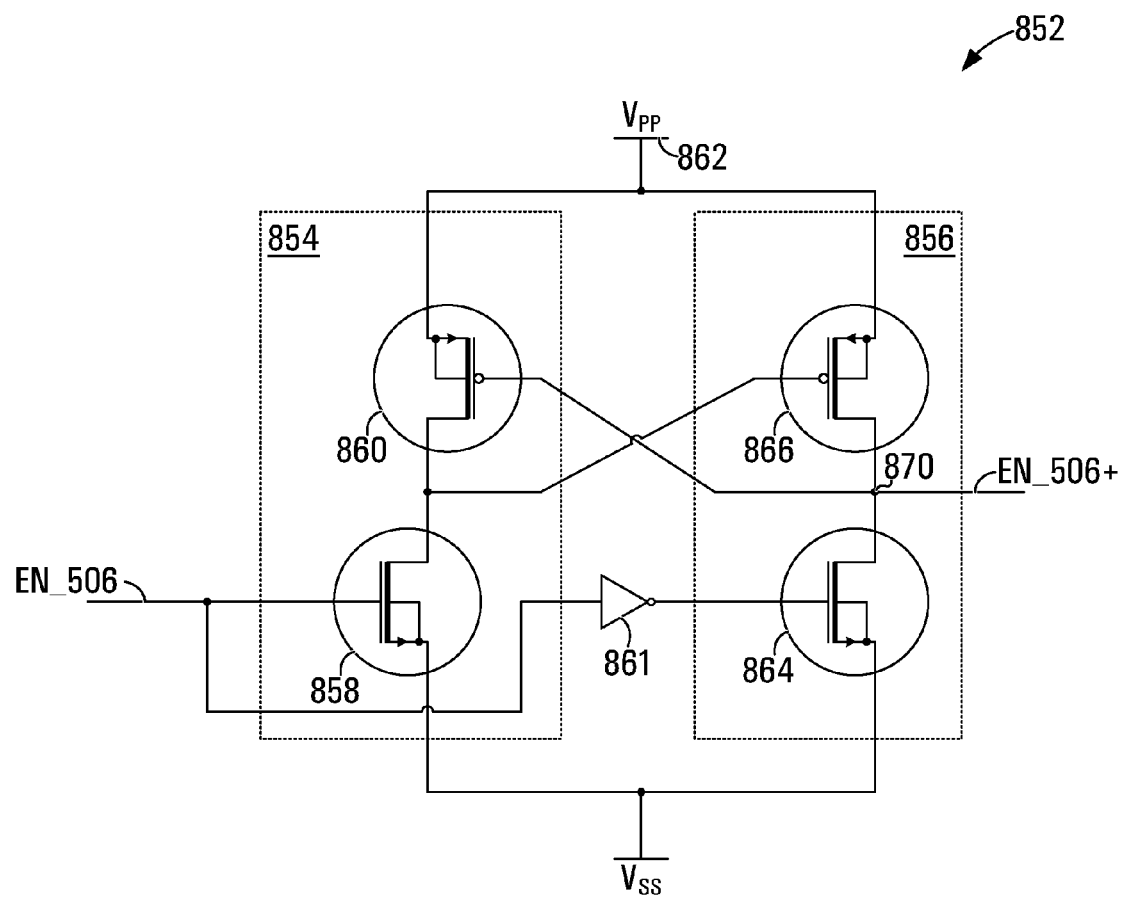

In the example embodiment shown in FIG. 6B, level shifter 852 converts an input voltage EN_506 (which is assumed to be a binary signal having a level that is either $V_{SS}$ or $V_{DD}$) into a level shifted output voltage EN_506+ (which will be a binary signal having a level that is either $V_{SS}$ or $V_{PP}$). Here, $V_{PP}$ represents a voltage level that is higher than $V_{DD}$. In a non-limiting example, $V_{DD}$ may be 1.8V and $V_{PP}$ may be 2.5V. Other possibilities exist and are contemplated as being within the scope of certain embodiments of the present invention.

Specifically, level shifter 852 comprises two interconnected branches of MOS transistors 854, 856. The first branch 854 comprises an NMOS transistor 858 whose gate receives input voltage EN_506. The source of NMOS transistor 858 is connected to power supply $V_{SS}$ and the drain of NMOS transistor 858 is connected to the drain of PMOS transistor 860. The source of PMOS transistor 860 is connected to power supply 862 at a voltage $V_{PP} > V_{DD}$. The second branch 856 comprises NMOS transistor 864 whose source is connected to power supply $V_{SS}$ and whose drain is connected to the drain of a PMOS transistor 866. The source of PMOS transistor 866 is connected to power supply 862 at voltage $V_{PP}$. The gate of NMOS transistor 864 is connected to the output of inverter 861 which inverts the input voltage EN_506. Also, the gate of PMOS transistor 860 in the first branch 854 is connected to the drain of PMOS transistor 866 in the second branch 856. In addition, the gate of PMOS transistor 866 in the second branch 856 is connected to the drain of PMOS transistor 860 in the first branch 854. Finally, the level shifted output voltage EN_506+ is taken at node 870 between the drain of NMOS transistor 864 and the drain of PMOS transistor 866. Those skilled in the art will thus appreciate from FIG. 6B that when input voltage EN_506 is at $V_{SS}$, the level shifted output voltage EN_506+ is at $V_{SS}$, and when input voltage EN_506 is at $V_{DD}$, the level shifted output voltage EN_506+ is at $V_{PP}$.

It should be appreciated that the symbols "$V_{DD}$", "$V_{SS}$", "$V_{PP}$" and "$V_{BB}$", which may seem familiar to some readers, are used for merely illustrative purposes as an aid to placing the voltage levels of various power supplies in context relative to one another. However, the actual voltage levels represented by the symbols "$V_{DD}$", "$V_{SS}$", "$V_{PP}$" and "$V_{BB}$" are not constrained to only those specific voltage levels that the reader may have come across by consulting the literature, nor are they prohibited from acquiring voltage levels that the reader may have come across as being represented in the literature by different symbols or by no symbol at all.

It should also be appreciated that analog termination control circuit 528B described above with reference to FIG. 3B can be used in an implementation of a semiconductor device having exclusively NMOS transistors or exclusively PMOS transistors, and as few as a single MOS transistor of one type or the other. Also, analog termination control circuit 528B can be used in an implementation of a semiconductor device irrespective of the voltage level provided by the $V_{TT}$ termination voltage power supply 450. Accordingly, reference is made to FIG. 7, where there is shown a termination circuit 901 for on-die termination of a terminal 914 connected to the internal portion 916 of a semiconductor device 900. The terminal 914 can be an input terminal, an output terminal or a bidirectional input/output terminal. In certain non-limiting embodiments, the terminal 914 can be configured to transmit and/or receive data signals varying between two voltage levels representative of corresponding logic values. The semiconductor device 900 that includes the internal portion 916 and the terminal 914 may be a memory chip or any other type of semiconductor device that can benefit from on-die termination.

Figure 7:
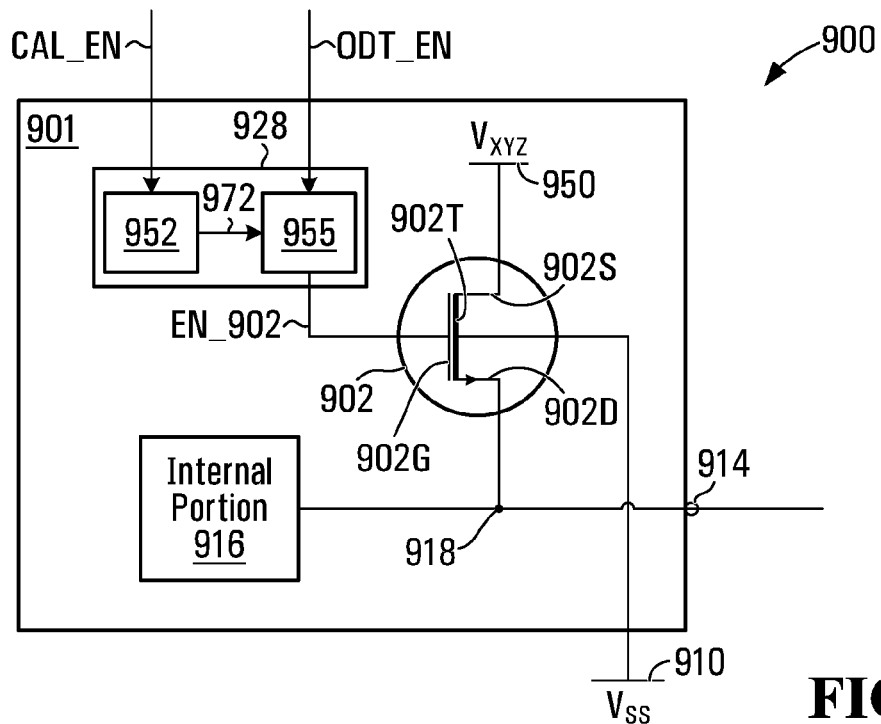
FIGS. 7 and 8 are circuit diagrams of a termination circuit for providing on-die termination for a terminal of a semiconductor device, in accordance with other specific non-limiting embodiments of the present invention.

Although the termination circuit 901 is shown as being connected within semiconductor device 900 to a point (or node 918) that is between the terminal 914 and the internal portion 916 of the semiconductor device 900, it should be appreciated that it is within the scope of embodiments of the present invention for the termination circuit 901 to be connected directly to the terminal 914. The termination circuit 901 includes a path between terminal 914 and a power supply 950 via the point/node 918, which is at a voltage $V_{XYZ}$. The voltage $V_{XYZ}$ can be a mid-point termination voltage such as $V_{DD}/2$, a pseudo open-drain termination voltage such as $V_{DD}$, a near ground termination voltage such as $V_{SS}$, or any other suitable termination voltage. As shown in FIG. 7, power supply 950 can be internal to the semiconductor device 900, in which case $V_{XYZ}$ can be said to be generated in an on-chip fashion. Alternatively, power supply 950 can be external to the semiconductor device 900 and accessible via a data terminal, for example. In this case, $V_{XYZ}$ can be said to be generated in an off-chip fashion. Power supply 950 can also be used for supplying the voltage $V_{XYZ}$ to other components of the semiconductor device 900, such as those comprised in the internal portion 916. Alternatively, power supply 950 can be dedicated to the task of on-die termination.

The path between terminal 914 and power supply 950 (via the point/node 918) includes at least one MOS transistor, including MOS transistor 902. The at least one MOS transistor, including MOS transistor 902, can be a PMOS transistor or an NMOS transistor. In the illustrated embodiment, there is one (1) MOS transistor 902, shown as an NMOS transistor, but it should be appreciated that there is no particular limitation on the number of MOS transistors in the path or on whether a particular MOS transistor in the path is a PMOS transistor or an NMOS transistor. Also, the path between terminal 914 and power supply 950 (via the point/node 918) can include MOS transistors placed in parallel, in series or a combination thereof.

MOS transistor 902 includes a gate 902G, which those skilled in the art will understand to be a control electrode. The gate 902G is driven by a gate voltage EN_902 supplied by termination control circuit 928.

In addition, MOS transistor 902 includes a first current carrying electrode 902S and a second current carrying electrode 902D. One of the current carrying electrodes is connected to power supply 950, while the other of the current carrying electrodes is connected to terminal 914 (via the point/node 918). Depending on which current carrying electrode is at a higher potential, either the first current carrying electrode will act as the "source" and the second current carrying electrode will act as the "drain", or vice versa.

Furthermore, MOS transistor 902 includes a substrate electrode 902T. The substrate electrode 902T is connected to power supply 910 via a pin (not shown). For an NMOS transistor 902 as shown, power supply 910 can be maintained at a voltage $V_{SS}$. The voltage $V_{SS}$ can be selected such that it provides sufficient voltage "headroom" to allow the components of the semiconductor device 900 and, in particular, the termination circuit 901, to function properly within the expected voltage swing of the signals at the terminal 914. Thus, when the signals at the terminal 914 are expected to vary between, say, 0.0V and 0.6V, it is possible to set $V_{SS}$ to 0V. Other possibilities are contemplated as being within the scope of certain embodiments of the present invention.

Termination control circuit 928 is configured to respond to assertion of an ODT_EN signal by causing the gate voltage EN_902 to change, thus provoking a change in conductive state of MOS transistor 902.

More specifically, when the ODT_EN signal is de-asserted (i.e., when on-die termination is disabled), the termination control circuit 928 is configured so as to cause the gate voltage EN_902 to be sufficiently low (e.g., $V_{SS}$) so as to ensure that an NMOS transistor 902 is placed in the off state. In the off state, MOS transistor 902 effectively acts as an open circuit between the first current carrying electrode 902S and the respective second current carrying electrode 902D.

In contrast, when the ODT_EN signal is asserted (i.e., when on-die termination is enabled), termination control circuit 928 causes the gate voltage EN_902 to change so as to acquire a level suitable for placing MOS transistor 902 in the ohmic region of operation.

The level of the gate voltage suitable for placing MOS transistor 902 in the ohmic region of operation is a function of, among possibly other parameters: (i) the fact that MOS transistor 902 is an NMOS transistor; (ii) the voltage $V_{XYZ}$ of power supply 950; and (iii) the threshold voltage of MOS transistor 902. From the above, it will be apparent that the conductive state in which MOS transistor 902 finds itself at a given point in time may be influenced by the instantaneous voltage at the terminal 914. In particular, the voltage at terminal 914 may, during peaks or valleys, occasionally push MOS transistor 902 out of the ohmic region and into a different region of operation. This does not constitute an impermissible situation. Overall, it should be appreciated that the level of the gate voltage suitable for placing MOS transistor 902 in the ohmic region of operation can be a level that ensures operation in the ohmic region of operation throughout a substantial range of the expected voltage swing of the signal at terminal 914, and need not guarantee that operation in the ohmic region is maintained continuously throughout the entire expected voltage swing of the signal at terminal 914.

Thus, for example, when $V_{XYZ}=V_{SS}=0V$ and the voltage at terminal 914 is expected to swing between 0V and 0.6V, a specific non-limiting example of a gate voltage range that places MOS transistor 902 in the ohmic region of operation (for a typical transistor threshold voltage $V_T$ of 0.5V) is 0.9V to 1.2V. With such an arrangement, MOS transistor 902 now operates in the ohmic region of operation throughout a substantial range of the expected voltage swing of the signal at terminal 914 while allowing analog control of the termination resistance.

It is noted that $V_{XYZ}$, which was described earlier as being the voltage level of power supply 950, is less than the gate voltage that places MOS transistor 902 in the ohmic region of operation. The opposite would be true if MOS transistor 902 were a PMOS transistor.

Figure 8:
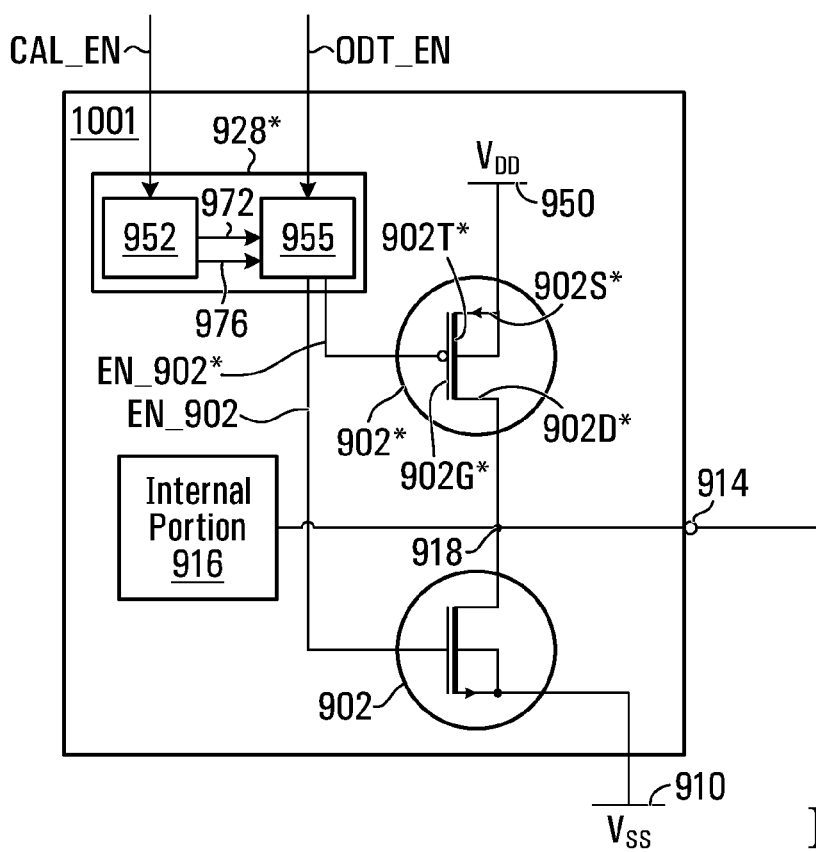

In a specific non-limiting embodiment, $V_{XYZ}$ can be substantially midway between the two voltages $V_{SS}$ and $V_{DD}$, e.g., $V_{XYZ}$–0.9 when $V_{SS}=0V$ and $V_{DD}=1.8V$. However, this is only one possibility. Other possibilities include a split termination scenario, as shown in FIG. 8, which illustrates a termination circuit 1001 similar to the termination circuit 901 of FIG. 7 but where $V_{XYZ}$ is set to $V_{DD}$, while an additional MOS transistor 902* complementary to MOS transistor 902 is provided between node 918 and $V_{DD}$. MOS transistor 902* is a PMOS transistor while MOS transistor 902 continues to be an NMOS transistor.

It should be appreciated that when MOS transistors 902 and 902* are placed in the ohmic region of operation, they effectively act as a resistors with a resistance that is approximated by the quotient of the drain-source voltage drop and the current flowing through the current carrying electrodes (drain and source). It is also noted that the path between power supply 950 and node 918 and the path between power supply 910 and node 918 can be kept free of passive resistors. As such, it will be apparent that conductivity between node 918 and power supplies 950 and 910 is attributable in substantial part to MOS transistors 902 and 902* having been placed in the ohmic region of operation. Additionally, it will be apparent that the electric resistance between node 918 and power supplies 950, 910 is attributable in substantial part to MOS transistors 902 and 902*, regardless of whether they are in an off state (in which case they act as an open circuit) or are placed in the ohmic region of operation (in which case they act as a resistor).

It should further be appreciated that varying the gate voltages EN_902 and EN_902* allows different electrical resistances to be imparted to the path between node 918 and power supplies 950 and 910. In particular, a slightly modified termination control circuit 928* can be used to control the electrical resistance of the path by controlling the gate voltages EN_902 and EN_902*. Specifically, the gate voltage EN_902 provided by the termination control circuit 928* varies between a first voltage at which MOS transistor 902 is placed in the off state, and a range of second voltages within which the gate voltage EN_902 can vary stepwise or continuously, while the gate voltage EN_902* provided by the termination control circuit 928* varies between a first voltage at which MOS transistor 902* is placed in the off state, and a range of second voltages within which the gate voltage EN_902* can vary stepwise or continuously. Specifically, when the gate voltages EN_902 and EN_902* are in the range of second voltages, MOS transistors 902 and 902* are placed in the ohmic region of operation and impart variable resistances that depend on the value of the gate voltages EN_902 and EN_902*, respectively. Thus, the resistances of MOS transistors 902 and 902* can be controlled to a certain degree of precision.

The termination control circuit 928* provides analog calibration functionality using calibration circuit 952 and multiplexer 955. A reference resistor (not shown) can be being accessed by the calibration circuit 952 through an external pin of the semiconductor device 900, although it should be understood that in some embodiments, the reference resistor may be internal to the calibration circuit 952 or may even be omitted. The reference resistor represents the desired termination resistance to be achieved by the termination circuit 950, and is a design parameter. The calibration circuit 952 receives a "calibration enable" (CAL_EN) signal from a controller (not shown) which can be asserted to indicate a desire of such controller to carry out a calibration process using the calibration circuit 952.

In one embodiment, the calibration circuit 952 may comprise a calibration circuit element (or multiple calibration circuit elements) that has (or have) the same resistance behaviour as a function of an applied voltage as MOS transistor 902 and/or 902* have as a function of the gate voltage EN_902 and/or EN_902*. Thus, responsive to assertion of the CAL_EN signal, the calibration circuit 952 identifies which applied voltage(s), when applied to the calibration circuit element(s), yield(s) a resistance that matches the resistance of the reference resistor. This can be done in an iterative fashion, starting with an initial applied voltage and ending with a final applied voltage. The final applied voltages are output to the multiplexer 955 in the form of analog calibration voltages 972 and/or 976.

In an alternative embodiment, the calibration circuit 952 includes or otherwise has access to a look-up table (not shown) that stores data regarding the resistance behaviour of MOS transistors 902 and/or 902* as a function of gate voltage, particularly in the ohmic region of operation. In such an embodiment, the calibration circuit 952 provides processing functionality. Specifically, since the calibration circuit 952 obtains the resistance of the reference resistor (either by receiving a value from an external source or by measuring it directly), the calibration circuit 952 consults the look-up table to determine the gate voltage that should be applied to the MOST transistors 902 and/or 902* so as to achieve a satisfactory match with respect to the resistance of the reference resistor. The gate voltages so determined are output to the multiplexer 955 in the form of the analog calibration voltages 972 and/or 976.

Other ways of achieving resistance matching will become apparent to those of skill in the art.

It should be appreciated that the analog calibration voltage 972 will be at a voltage level that takes into consideration the fact that MOS transistor 902 is an NMOS device and depends on whether MOS transistor 902 is to be placed in the ohmic region of operation and, if so, the precise resistance sought to be imparted by MOS transistor 902. For example, the analog calibration voltage can be set to $V_{SS}$ when MOS transistor 902 is to be placed in the off state, and can be set to within a range bounded by $V_{D1}$ and $V_{D2}$ (which may or may not include $V_{DD}$) when MOS transistor 902 is to be placed in the ohmic region of operation.

It should also be appreciated that the analog calibration voltage 976 will be at a voltage level that takes into consideration the fact that MOS transistor 902* is a PMOS device and depends on whether MOS transistor 902* is to be placed in the ohmic region of operation and, if so, the precise resistance sought to be imparted by MOS transistor 902*. For example, the analog calibration voltage can be set to $V_{DD}$ when MOS transistor 902* is to be placed in the off state, and can be set to within a range bounded by $V_{S1}$ and $V_{S2}$ (which may or may not include $V_{SS}$) when MOS transistor 902* is to be placed in the ohmic region of operation.

For a split termination implementation, both NMOS and PMOS devices are usually both enabled or both disabled. When enabled, calibrating the resistances of the NMOS and PMOS devices to be equal results in an effective termination voltage at the mid-point between $V_{DD}$ and $V_{SS}$ and an effective termination resistance equal to one half of the calibrated resistance value of either of the NMOS or PMOS devices.

The analog calibration voltages are selected by the ODT_EN signal at the multiplexer 955 to yield gate voltage EN_902 and EN_902*. Specifically, when the ODT_EN signal goes high to indicate that on-die termination is enabled, the analog calibration voltages are transferred unchanged through the multiplexer 955 to gate voltages EN_902 and EN_902*. Thus, where the analog calibration voltages are at levels suitable for placing MOS transistors 902 and 902* in the off state, the gate voltages EN_902 and EN_902* will acquire these levels. Similarly, where the analog calibration voltages are at levels suitable for placing MOS transistors 902 and 902* in the ohmic region of operation so as to impart certain desired resistances, the gate voltages EN_902 and EN_902* will acquire these levels.

On the other hand, when the ODT_EN signal goes low to indicate that on-die termination is disabled, the gate voltages EN_902 and EN_902* are forced to levels suitable for placing MOS transistors 902 and 902* in the off state, namely $V_{SS}$ and $V_{DD}$, respectively. Stated differently, the levels of the analog calibration voltages received from the calibration circuit 952 are overridden by disabling on-die termination. It should be appreciated that the calibration circuit 952 and the multiplexer 955 need not be separate and indeed may be combined into a single module.

In the context of the examples described above, various elements and circuits are shown connected to each other for the sake of simplicity. In practical applications of the present invention, elements, circuits, etc. may be connected directly to each other. As well, elements, circuits etc. may be connected indirectly to each other through other elements, circuits, etc., necessary for operation of the devices, systems or apparatus of which they form a part. Thus, in actual configuration, the various elements and circuits can be directly or indirectly coupled with or connected to each other, unless otherwise specified.

Certain adaptations and modifications of the described embodiments can be made. Therefore, the above discussed embodiments are to be considered illustrative and not restrictive. Also it should be appreciated that additional elements that may be needed for operation of certain embodiments of the present invention have not been described or illustrated as they are assumed to be within the purview of the person of ordinary skill in the art. Moreover, certain embodiments of the present invention may be free of, may lack and/or may function without any element that is not specifically disclosed herein.

What is claimed is:

1. In a semiconductor device having a terminal connected to an internal portion, a termination circuit for providing on-die termination for the terminal of the semiconductor device, the termination circuit comprising:

a power supply comprising a bias stage, an output stage and a capacitor, the output stage including a complementary pair of MOS transistors, wherein the voltage supplied at an output of the power supply is taken from a junction between the complementary pair of MOS transistors, the capacitor being electrically connected between the junction and a reference potential;

a plurality of transistors connected between the terminal and the output of the power supply, the plurality of transistors including at least one NMOS transistor and at least one PMOS transistor;

control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled;

wherein the voltage at the output of the power supply is less than each said NMOS gate voltage and greater than each said PMOS gate voltage.

2. The termination circuit defined in claim 1, wherein to place the plurality of transistors in an ohmic region of operation, the gate of each of the at least one NMOS transistor is driven by a first voltage and the gate of each of the at least one PMOS transistor is driven by a second voltage.

3. The termination circuit defined in claim 2, wherein the first voltage is approximately 1.8 V and wherein the second voltage is approximately 0 V.

4. The termination circuit defined in claim 2, wherein the voltage at the output of the power supply is substantially midway between the first voltage and the second voltage.

5. The termination circuit defined in claim 4, wherein the voltage at the output of the power supply is midway between the first voltage and the second voltage.

6. The termination circuit defined in claim 1, wherein the at least one NMOS transistor includes at least two NMOS transistors, the at least two NMOS transistors being placed in the ohmic region of operation by the corresponding NMOS gate voltages being set to different levels.

7. The termination circuit defined in claim 6, wherein the at least one PMOS transistor includes at least two PMOS transistors, the at least two PMOS transistors being placed in the ohmic region of operation by the corresponding PMOS gate voltages being set to different levels.

8. The termination circuit defined in claim 1, wherein the termination circuit is implemented on a first semiconductor chip, and wherein the power supply is implemented on a second semiconductor chip different from the first semiconductor chip.

9. The termination circuit defined in claim 1, wherein the termination circuit and the power supply are implemented on the same semiconductor chip.

10. The termination circuit defined in claim 1,
wherein each of the at least one NMOS transistor comprises a gate and a pair of current carrying electrodes, wherein one of the current carrying electrodes is connected to the terminal, wherein the other of the current carrying electrodes is connected to the output of the power supply and wherein the gate is driven by the corresponding NMOS gate voltage from the control circuitry; and
wherein each of the at least one PMOS transistor comprises a gate and a pair of current carrying electrodes, wherein one of the current carrying electrodes is connected to the terminal, wherein the other of the current carrying electrodes is connected to the output of the power supply and wherein the gate is driven by the corresponding PMOS gate voltage from the control circuitry.

11. The termination circuit defined in claim 10, wherein each of the at least one NMOS transistor further comprises a substrate electrode connected to a first substrate power supply that supplies a first substrate voltage, and wherein each of the at least one PMOS transistor further comprises a substrate electrode connected to a second substrate power supply that supplies a second substrate voltage greater than the first substrate voltage.

12. The termination circuit defined in claim 11, wherein to place the plurality of transistors in an ohmic region of operation, the NMOS gate voltages are set to a common first voltage and the PMOS gate voltages are set to a common second voltage, wherein the second substrate voltage equals the first voltage, and wherein the first substrate voltage equals the second voltage.

13. The termination circuit defined in claim 11, wherein the second substrate voltage and the first voltage are at approximately 1.8 V, and wherein the first substrate voltage and the second voltage are at approximately 0 V.

14. The termination circuit defined in claim 11, wherein the second voltage is less than the first substrate voltage.

15. The termination circuit defined in claim 11, wherein the second voltage is taken from a cell substrate back-bias power supply.

16. The termination circuit defined in claim 11, wherein the first voltage is greater than the second substrate voltage.

17. The termination circuit defined in claim 11, wherein the first voltage is taken from a wordline power supply.

18. The termination circuit defined in claim 1, wherein each of the at least one NMOS transistor has a substantially identical channel width.

19. The termination circuit defined in claim 18, wherein each of the at least one PMOS transistor has a substantially identical channel width.

20. The termination circuit defined in claim 1, wherein the at least one NMOS transistor includes at least two NMOS transistors having different channel widths.

21. The termination circuit defined in claim 20, wherein the at least one PMOS transistor includes at least two PMOS transistors having different channel widths.

22. The termination circuit defined in claim 1, wherein the control circuitry is further configured to place the plurality of transistors in an off state when on-die termination is disabled.

23. The termination circuit defined in claim 22, wherein the control circuitry comprises an input for receiving an enable signal indicative of whether on-die termination is enabled or disabled.

24. The termination circuit defined in claim 1, the plurality of transistors being selected MOS transistors, the termination circuit further comprising at least one unselected MOS transistor connected between the terminal and the output of the power supply, each of the at least one unselected MOS transistor having a gate driven by a corresponding gate voltage that places the at least one unselected MOS transistor in an off state when on-die termination is enabled and also when on-die termination is disabled.

25. The termination circuit defined in claim 24, wherein the selected MOS transistors and the at least one unselected MOS transistor constitute an overall set of MOS transistors, wherein the control circuitry comprises calibrator circuitry configured to carry out a calibration process for identifying the plurality of selected MOS transistors from within the overall set of MOS transistors.

26. The termination circuit defined in claim 25, wherein the calibrator circuitry comprises a plurality of internal resistive devices each matched to a resistance imparted by a respective MOS transistor in the overall set of MOS transistors when placed in the ohmic region of operation, wherein the calibrator circuitry has access to a reference resistance, wherein the calibration process comprises determining a particular combination of the internal resistive devices whose collective resistance substantially equals the reference resistance, wherein for each of the internal resistive devices in the particular combination, the respective MOS transistor in the overall set of MOS transistors is identified as one of the selected MOS transistors.

27. The termination circuit defined in claim 25, wherein the calibrator circuitry has access to a lookup table specifying a resistance imparted by each MOS transistor in the overall set of MOS transistors when placed in the ohmic region of operation, wherein the calibration process comprises consulting the lookup table to identify a particular combination of MOS transistors in the overall set of MOS transistors whose collective resistance substantially equals the reference resistance, wherein the MOS transistors in the particular combination are identified as the selected MOS transistors.

28. The termination circuit defined in claim 25, wherein the calibrator circuitry carries out the calibration process in response to detecting that a received calibration enable signal has been asserted.

29. The termination circuit defined in claim 24, wherein the electrical resistance between the output of the power supply and the terminal is attributable in substantial part to the plurality of selected MOS transistors and the at least one unselected MOS transistor.

30. The termination circuit defined in claim 1, the semiconductor device having a second terminal connected to the internal portion, the termination circuit further comprising:
a plurality of second transistors connected between the second terminal and the output of the power supply, the plurality of second transistors including at least one second NMOS transistor and at least one second PMOS transistor;
wherein the control circuitry is further for driving a gate of each of the at least one second NMOS transistor with a corresponding second NMOS gate voltage and for driving a gate of each of the at least one second PMOS transistor with a corresponding second PMOS gate voltage, the control circuitry being configured to control the second NMOS and PMOS gate voltages so as to place the plurality of second transistors in an ohmic region of operation when on-die termination is enabled;
wherein the voltage at the output of the power supply is less than each said second NMOS gate voltage and greater than each said second PMOS gate voltage.

31. The termination circuit defined in claim 1, wherein the electrical resistance between the output of the power supply and the terminal is attributable in substantial part to the plurality of transistors.

32. The termination circuit defined in claim 1, wherein when the plurality of transistors are placed in the ohmic region of operation, the electrical conductivity between the output of the power supply and the terminal is attributable in substantial part to the plurality of transistors.

33. The termination circuit defined in claim 1, wherein the voltage at the output of the power supply is approximately 0.9 V.

34. A semiconductor device with on-die termination, comprising:
an internal portion;
a power supply comprising a bias stage, an output stage and a capacitor, the output stage including a complementary pair of MOS transistors, wherein the voltage supplied at an output of the power supply is taken from a junction between the complementary pair of MOS transistors, the capacitor being electrically connected between the junction and a reference potential;
a terminal connected to the internal portion;
a plurality of transistors connected between the terminal and the power supply, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled;
wherein the voltage at the output of the power supply is less than each said NMOS gate voltage and greater than each said PMOS gate voltage.

35. In a semiconductor device having a terminal connected to an internal portion, a termination circuit for providing on-die termination for the terminal of the semiconductor device, the termination circuit comprising:
a plurality of transistors connected between the terminal and a power supply, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled, wherein the power supply supplies a voltage that is less than each said NMOS gate voltage and greater than each said PMOS gate voltage;
a first level shifter between the control circuitry and the gate of a corresponding one of the at least one NMOS transistor, the first level shifter configured to output the corresponding NMOS gate voltage based on an input voltage provided by the control circuitry, the input voltage having a smaller dynamic range than the corresponding NMOS gate voltage; and
a second level shifter between the control circuitry and the gate of a corresponding one of the at least one PMOS transistor, the second level shifter configured to output the corresponding PMOS gate voltage based on a second input voltage provided by the control circuitry, the second input voltage having a smaller dynamic range than the corresponding PMOS gate voltage.

36. The termination circuit defined in claim 35, wherein to place the plurality of transistors in an ohmic region of operation, the gate of each of the at least one NMOS transistor is driven by a first voltage and the gate of each of the at least one PMOS transistor is driven by a second voltage, wherein the voltage supplied by the power supply is substantially midway between the first voltage and the second voltage.

37. The termination circuit defined in claim 35,
wherein each of the at least one NMOS transistor comprises a gate and a pair of current carrying electrodes, wherein one of the current carrying electrodes is connected to the terminal, wherein the other of the current carrying electrodes is connected to the power supply and wherein the gate is driven by the corresponding NMOS gate voltage from the control circuitry;

wherein each of the at least one PMOS transistor comprises a gate and a pair of current carrying electrodes, wherein one of the current carrying electrodes is connected to the terminal, wherein the other of the current carrying electrodes is connected to the power supply and wherein the gate is driven by the corresponding PMOS gate voltage from the control circuitry;

wherein each of the at least one NMOS transistor further comprises a substrate electrode connected to a power supply that supplies a first substrate voltage, and wherein each of the at least one PMOS transistor further comprises a substrate electrode connected to a power supply that supplies a second substrate voltage greater than the first substrate voltage; and wherein to place the plurality of transistors in an ohmic region of operation, the NMOS gate voltages are set to a common first voltage and the PMOS gate voltages are set to a common second voltage, wherein the second substrate voltage equals the first voltage, and wherein the first substrate voltage equals the second voltage.

38. The termination circuit defined in claim 35, wherein the at least one NMOS transistor includes at least two NMOS transistors, the at least two NMOS transistors being placed in the ohmic region of operation by the corresponding NMOS gate voltages being set to different levels.

39. The termination circuit defined in claim 38, wherein the at least one PMOS transistor includes at least two PMOS transistors, the at least two PMOS transistors being placed in the ohmic region of operation by the corresponding PMOS gate voltages being set to different levels.

40. The termination circuit defined in claim 35, the plurality of transistors being selected MOS transistors, the termination circuit further comprising at least one unselected MOS transistor connected between the terminal and the power supply, each of the at least one unselected MOS transistor having a gate driven by a corresponding gate voltage that places the at least one unselected MOS transistor in an off state when on-die termination is enabled and also when on-die termination is disabled.

41. A semiconductor device with on-die termination, comprising:
an internal portion;
a power supply;
a terminal connected to the internal portion;
a plurality of transistors connected between the terminal and the power supply, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled, wherein the power supply supplies a voltage that is less than each said NMOS gate voltage and greater than each said PMOS gate voltage;
a first level shifter between the control circuitry and the gate of a corresponding one of the at least one NMOS transistor, the first level shifter configured to output the corresponding NMOS gate voltage based on an input voltage provided by the control circuitry, the input voltage having a smaller dynamic range than the corresponding NMOS gate voltage; and
a second level shifter between the control circuitry and the gate of a corresponding one of the at least one PMOS transistor, the second level shifter configured to output the corresponding PMOS gate voltage based on a second input voltage provided by the control circuitry, the second input voltage having a smaller dynamic range than the corresponding PMOS gate voltage.

42. A semiconductor device with on-die termination, comprising:
an internal portion;
a power terminal for connection to an off-chip power supply;
a data terminal connected to the internal portion;
a plurality of transistors connected between the data terminal and the power terminal, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled, wherein the power terminal supplies a voltage that is less than each said NMOS gate voltage and greater than each said PMOS gate voltage;
a first level shifter between the control circuitry and the gate of a corresponding one of the at least one NMOS transistor, the first level shifter configured to output the corresponding NMOS gate voltage based on an input voltage provided by the control circuitry, the input voltage having a smaller dynamic range than the corresponding NMOS gate voltage; and
a second level shifter between the control circuitry and the gate of a corresponding one of the at least one PMOS transistor, the second level shifter configured to output the corresponding PMOS gate voltage based on a second input voltage provided by the control circuitry, the second input voltage having a smaller dynamic range than the corresponding PMOS gate voltage.

43. In a semiconductor device having a terminal connected to an internal portion, a termination circuit for providing on-die termination for the terminal of the semiconductor device, the termination circuit comprising:
a plurality of transistors connected between the terminal and a power supply, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled;
wherein the power supply supplies a voltage that is less than each said NMOS gate voltage and greater than each said PMOS gate voltage; and
wherein the control circuitry comprises calibrator circuitry with access to a reference resistance, the calibrator circuitry configured to carry out a calibration process for identifying a plurality of analog calibration voltages that would cause the at least one NMOS transistor and the at least one PMOS transistor to impart a resistance substantially equal to the reference resistance if supplied to the MOS transistor as the corresponding NMOS and PMOS gate voltages, respectively.

44. The termination circuit defined in claim 43, wherein the calibration circuitry carries out the calibration process in response to detecting that a received calibration enable signal has been asserted.

45. The termination circuit defined in claim 43, wherein the control circuitry further comprises a multiplexer for causing the analog calibration voltages to be transferred to the corresponding NMOS and PMOS gate voltages, respectively, when on-die termination is enabled.

46. The termination circuit defined in claim 43, wherein the calibrator circuitry comprises internal circuit elements each exhibiting a behaviour as a function of an applied voltage that corresponds to a behavior of one of the at least one NMOS transistor and the at least one PMOS transistor as a function of the corresponding NMOS or PMOS gate voltage, wherein the calibration process comprises determining the analog calibration voltages as the levels of applied voltage that result in the internal circuit elements collectively exhibiting a resistance that substantially matches the reference resistance.

47. The termination circuit defined in claim 43, wherein the calibrator circuitry has access to a lookup table specifying a resistance behavior of the at least one NMOS transistor and the at least one PMOS transistor as a function of the corresponding NMOS or PMOS gate voltage, wherein the calibration process comprises consulting the lookup table on a basis of the reference resistance to determine particular voltages, the particular voltages being the analog calibration voltages.

48. The termination circuit defined in claim 43, wherein to place the plurality of transistors in an ohmic region of operation, the gate of each of the at least one NMOS transistor is driven by a first voltage and the gate of each of the at least one PMOS transistor is driven by a second voltage, wherein the voltage supplied by the power supply is substantially midway between the first voltage and the second voltage.

49. A semiconductor device with on-die termination, comprising:
an internal portion;
a power supply;
a terminal connected to the internal portion;
a plurality of transistors connected between the terminal and the power supply, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled;
wherein the power supply supplies a voltage that is less than each said NMOS gate voltage and greater than each said PMOS gate voltage; and
wherein the control circuitry comprises calibrator circuitry with access to a reference resistance, the calibrator circuitry configured to carry out a calibration process for identifying a plurality of analog calibration voltages that would cause the at least one NMOS transistor and the at least one PMOS transistor to impart a resistance substantially equal to the reference resistance if supplied to the MOS transistor as the corresponding NMOS and PMOS gate voltages, respectively.

50. A semiconductor device with on-die termination, comprising:
an internal portion;
a power terminal for connection to an off-chip power supply;
a data terminal connected to the internal portion;
a plurality of transistors connected between the data terminal and the power terminal, the plurality of transistors including at least one NMOS transistor and at least one PMOS transistor;
control circuitry for driving a gate of each of the at least one NMOS transistor with a corresponding NMOS gate voltage and for driving a gate of each of the at least one PMOS transistor with a corresponding PMOS gate voltage, the control circuitry being configured to control the NMOS and PMOS gate voltages so as to place the plurality of transistors in an ohmic region of operation when on-die termination is enabled;
wherein the power terminal supplies a voltage that is less than each said NMOS gate voltage and greater than each said PMOS gate voltage; and
wherein the control circuitry comprises calibrator circuitry with access to a reference resistance, the calibrator circuitry configured to carry out a calibration process for identifying a plurality of analog calibration voltages that would cause the at least one NMOS transistor and the at least one PMOS transistor to impart a resistance substantially equal to the reference resistance if supplied to the MOS transistor as the corresponding NMOS and PMOS gate voltages, respectively.

* * * * *